United States Patent
Li et al.

(10) Patent No.: US 9,413,349 B1
(45) Date of Patent: Aug. 9, 2016

(54) HIGH-K (HK)/METAL GATE (MG) (HK/MG) MULTI-TIME PROGRAMMABLE (MTP) SWITCHING DEVICES, AND RELATED SYSTEMS AND METHODS

(71) Applicant: QUALCOMM Incorporated, San Diego, CA (US)

(72) Inventors: Xia Li, San Diego, CA (US); Xiao Lu, San Diego, CA (US); Xiaonan Chen, San Diego, CA (US); Zhongze Wang, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/676,228

(22) Filed: Apr. 1, 2015

(51) Int. Cl.
| | |
|---|---|
| G11C 16/10 | (2006.01) |
| H03K 17/687 | (2006.01) |
| H01L 29/792 | (2006.01) |
| H01L 29/51 | (2006.01) |
| H01L 27/115 | (2006.01) |
| G11C 16/04 | (2006.01) |

(52) U.S. Cl.
CPC .......... *H03K 17/687* (2013.01); *G11C 16/0466* (2013.01); *H01L 27/11568* (2013.01); *H01L 29/51* (2013.01); *H01L 29/792* (2013.01); *H01L 27/11563* (2013.01)

(58) Field of Classification Search
CPC ....................................................... G11C 16/10
USPC ..................................................... 365/185.01
See application file for complete search history.

(56) References Cited

U.S. PATENT DOCUMENTS

| | | | |
|---|---|---|---|
| 5,986,939 | A | 11/1999 | Yamada |
| 6,784,480 | B2 * | 8/2004 | Bhattacharyya ....... G11C 16/10 257/314 |
| 6,940,751 | B2 | 9/2005 | Peng et al. |
| 7,164,168 | B2 * | 1/2007 | Forbes .............. H01L 27/11521 257/315 |
| 7,447,082 | B2 | 11/2008 | Wang et al. |

(Continued)

FOREIGN PATENT DOCUMENTS

EP    1638110 A1    3/2006

OTHER PUBLICATIONS

International Search Report and Written Opinion for PCT/US2016/024456, mailed Jun. 8, 2016, 12 pages.

*Primary Examiner* — Son Mai
(74) *Attorney, Agent, or Firm* — Withrow & Terranova, PLLC

(57) ABSTRACT

Aspects disclosed in the detailed description include high-k (HK)/metal gate (MG) (HK/MG) multi-time programmable (MTP) switching devices, and related systems and methods. One type of HK/MG MTP switching device is an MTP metal-oxide semiconductor (MOS) field-effect transistor (MOSFET). When the MTP MOSFET is programmed, a charge trap may build up in the MTP MOSFET due to a switching electrical current induced by a switching voltage. The charge trap reduces the switching window and endurance of the MTP MOSFET, thus reducing reliability in accessing the information stored in the MTP MOSFET. In this regard, an HK/MG MTP switching device comprising the MTP MOSFET is configured to eliminate the switching electrical current when the MTP MOSFET is programmed. By eliminating the switching electrical current, it is possible to avoid a charge trap in the MTP MOSFET, thus restoring the switching window and endurance of the MTP MOSFET for reliable information access.

32 Claims, 14 Drawing Sheets

(56) References Cited

U.S. PATENT DOCUMENTS

| | | | | |
|---|---|---|---|---|
| 7,512,013 B2 * | 3/2009 | Wu | ................... | G11C 16/0475 365/185.13 |
| 7,615,821 B2 * | 11/2009 | Sim | ................... | G11C 16/0466 257/324 |
| 7,835,192 B2 | 11/2010 | Chang et al. | | |
| 8,432,751 B2 * | 4/2013 | Hafez | ................... | G11C 17/16 365/185.03 |
| 8,767,433 B2 | 7/2014 | Kurjanowicz et al. | | |
| 2008/0237694 A1 | 10/2008 | Specht et al. | | |
| 2009/0218611 A1 * | 9/2009 | Forbes | .............. | H01L 27/11553 257/315 |
| 2014/0043899 A1 | 2/2014 | Chang et al. | | |

* cited by examiner

HIGH-K (HK)/METAL GATE (MG) (HK/MG) MULTI-TIME PROGRAMMABLE (MTP) SWITCHING DEVICES, AND RELATED SYSTEMS AND METHODS

BACKGROUND

I. Field of the Disclosure

The technology of the disclosure relates generally to metal-oxide semiconductor (MOS) field-effect transistors (MOSFETs), and particular to MOSFETs used as programmable switching devices, such as in memory cells.

II. Background

In modern computing systems, processors such as central processing units (CPUs) and digital signal processors (DSPs) process binary input signals based on a set of machine executable binary instructions and generate binary output signals as a result. To produce the expected results, processors must be able to accurately determine the state of an input signal (e.g., whether the input signal represents a binary zero or a binary one). The determinations are usually based on detecting a voltage level of the input signal and are carried out by logic gates. These logic gates may consist of various metal-oxide semiconductor (MOS) field-effect transistors (MOSFETs) arranged in a manner as to provide the desired logic operation. A MOSFET may be an n-channel MOSFET (nMOSFET) or a p-channel MOSFET (pMOSFET) depending on substrate materials.

In this regard, FIG. 1 illustrates an exemplary nMOSFET 10 that may be included in a logic gate. The nMOSFET 10 comprises a metal gate (MG) 12, an n-type source region 14, an n-type drain region 16, and a p-type substrate (P-sub) (body) 18. A high-k (HK) dielectric layer/interface layer 20 is disposed between the metal gate 12 and the body 18. The metal gate 12, the n-type source region 14, and the n-type drain region 16 are coupled to a gate (G) electrode 22, a source (S) electrode 24, and a drain (D) electrode 26, respectively.

With continuing reference to FIG. 1, a gate voltage ($V_G$) 28 and a source voltage ($V_S$) 30 provide a switching voltage ($V_{GS}$) 32 that controls whether the nMOSFET 10 is in a depletion mode or an inversion mode. If the switching voltage ($V_{GS}$) 32 is less than a threshold voltage ($V_T$) of the nMOSFET 10, the nMOSFET 10 is in the depletion mode regardless of a drain voltage ($V_D$) 34. When the nMOSFET 10 is in the depletion mode, a channel region 36 between the n-type source region 14 and the n-type drain region 16 becomes highly resistive. As a result, no electrical current flows between the n-type source region 14 and the n-type drain region 16. When the switching voltage ($V_{GS}$) 32 is greater than or equal to the threshold voltage ($V_T$) of the nMOSFET 10, the nMOSFET 10 switches into an inversion mode, and the channel region 36 becomes conductive. In the inversion mode, if a drain-to-source voltage ($V_{DS}$) 38 is applied between the drain (D) electrode 26 and the source (S) electrode 24, electrons 40 are drawn to the n-type drain region 16 from the n-type source region 14, thus generating a drain current ($I_D$) 42 flowing from the n-type drain region 16 to the n-type source region 14.

SUMMARY OF THE DISCLOSURE

Aspects disclosed in the detailed description include high-k (HK)/metal gate (MG) (HK/MG) multi-time programmable (MTP) switching devices, and related systems and methods. One type of HK/MG MTP switching device is an MTP metal-oxide semiconductor (MOS) field-effect transistor (MOSFET), which may be programmed to store information by applying a switching voltage to the MTP MOSFET. However, when the MTP MOSFET is programmed to store information, a charge trap may build up in an HK dielectric layer/interface layer of the MTP MOSFET due to a switching electrical current induced by the applied switching voltage. The charge trap reduces the switching window, which indicates a differential between a pre-switching threshold voltage and a post-switching threshold voltage, and endurance of the MTP MOSFET, thus reducing reliability in accessing the information stored in the MTP MOSFET. In this regard, an HK/MG MTP switching device comprising the MTP MOSFET is provided and is configured to eliminate the switching electrical current when the MTP MOSFET is programmed. By eliminating the switching electrical current during MTP MOSFET programming, it is possible to avoid a charge trap in the MTP MOSFET, thus restoring the switching window and endurance of the MTP MOSFET for more reliable information access.

In this regard, in one aspect, an HK/MG MTP switching device is provided. The HK/MG MTP switching device comprises a MOSFET. The MOSFET comprises a body forming a channel region between a source electrode and a drain electrode. The MOSFET also comprises a gate electrode positioned above the body and an HK dielectric layer disposed between the body and the gate electrode. The MOSFET is configured to operate in a first state when a switching voltage ($V_{GS}$) applied between the gate electrode and the source electrode is greater than a first threshold voltage for the MOSFET. The MOSFET is further configured to operate in a second state different from the first state when the switching voltage ($V_{GS}$) is less than a second threshold voltage for the MOSFET. The HK/MG MTP switching device also comprises a switching controller. The switching controller is configured to apply the switching voltage ($V_{GS}$) between the gate electrode and the source electrode of the MOSFET to program the MOSFET in either the first state or the second state, without an electrical current being generated in the channel region.

In another aspect, a means for switching an HK/MG MTP switching device is provided. The means for switching the HK/MG MTP switching device comprises a MOSFET. The MOSFET comprises a body forming a channel region between a source electrode and a drain electrode. The MOSFET also comprises a gate electrode positioned above the body and an HK dielectric layer disposed between the body and the gate electrode. The MOSFET is configured to operate in a first state when a switching voltage ($V_{GS}$) applied between the gate electrode and the source electrode is greater than a first threshold voltage for the MOSFET. The MOSFET is further configured to operate in a second state different from the first state when the switching voltage ($V_{GS}$) is less than a second threshold voltage for the MOSFET. The means for switching the HK/MG MTP switching device also comprises a means for controlling the MOSFET. The means for controlling the MOSFET comprises applying the switching voltage ($V_{GS}$) between the gate electrode and the source electrode of the MOSFET to program the MOSFET in either the first state or the second state without an electrical current being generated in the channel region.

In another aspect, a method for preventing a charge trap when programming an HK/MG MTP switching device is provided. The method comprises determining a type of a MOSFET comprised in an HK/MG MTP switching device by a switching controller. The method also comprises determining a gate voltage and a source voltage based on the type of the MOSFET to provide a switching voltage ($V_{GS}$) for programming or erasing the MOSFET. The method further comprises applying the gate voltage and the source voltage to a gate electrode and a source electrode of the MOSFET, respectively. The method also comprises keeping a drain electrode floating or applying a drain voltage the equal to the source voltage to the drain electrode of the MOSFET.

In another aspect, a memory system based on HK/MG MTP switching devices is provided. The memory system comprises a memory array comprising a plurality of MOSFETs arranged into M rows and N columns, wherein M and N are finite integers. The memory system also comprises M word lines (WLs) coupled to the M rows, respectively, N bit lines (BLs) coupled to the N columns, respectively, and N source lines (SLs) coupled to the N columns, respectively. Each of the plurality of MOSFETs comprises a gate electrode coupled to a respective WL among the M WLs. Each of the plurality of MOSFETs also comprises a source electrode coupled to a respective SL among the N SLs. Each of the plurality of MOSFETs also comprises a drain electrode coupled to a respective BL among the N BLs. The memory system also comprises a memory controller coupled to the M WLs, the N BLs, and the N SLs.

DETAILED DESCRIPTION

Figure 1:
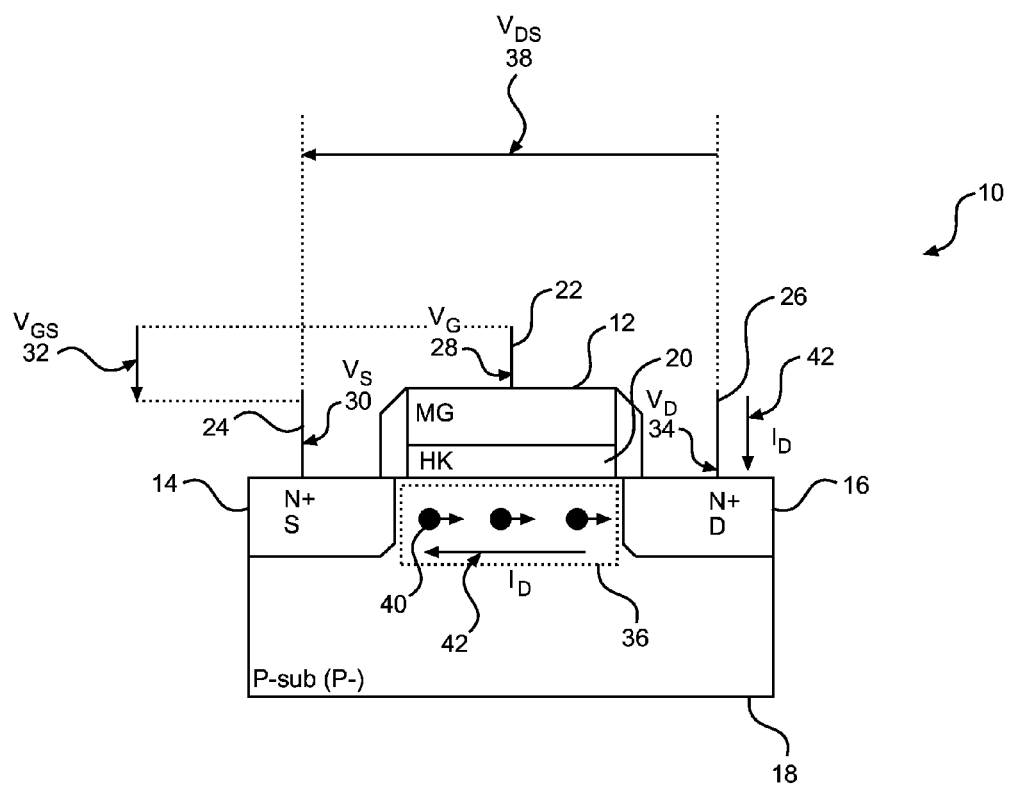
FIG. 1 illustrates an exemplary n-channel metal-oxide semiconductor (MOS) field-effect transistor (MOSFET) (nMOSFET) that may be programmed to function in a logic gate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include high-k (HK)/metal gate (MG) (HK/MG) multi-time programmable (MTP) switching devices, and related systems and methods. One type of HK/MG MTP switching device is an MTP metal-oxide semiconductor (MOS) field-effect transistor (MOSFET), which may be programmed to store information by applying a switching voltage to the MTP MOSFET. However, when the MTP MOSFET is programmed to store information, a charge trap may build up in an HK dielectric layer/interface layer of the MTP MOSFET due to a switching electrical current induced by the applied switching voltage. The charge trap reduces the switching window, which indicates a differential between a pre-switching threshold voltage and a post-switching threshold voltage, and endurance of the MTP MOSFET, thus reducing reliability in accessing the information stored in the MTP MOSFET. In this regard, an HK/MG MTP switching device comprising the MTP MOSFET is provided and is configured to eliminate the switching electrical current when the MTP MOSFET is programmed. By eliminating the switching electrical current during MTP MOSFET programming, it is possible to avoid a charge trap in the MTP MOSFET, thus restoring the switching window and endurance of the MTP MOSFET for more reliable information access.

Figure 2A:
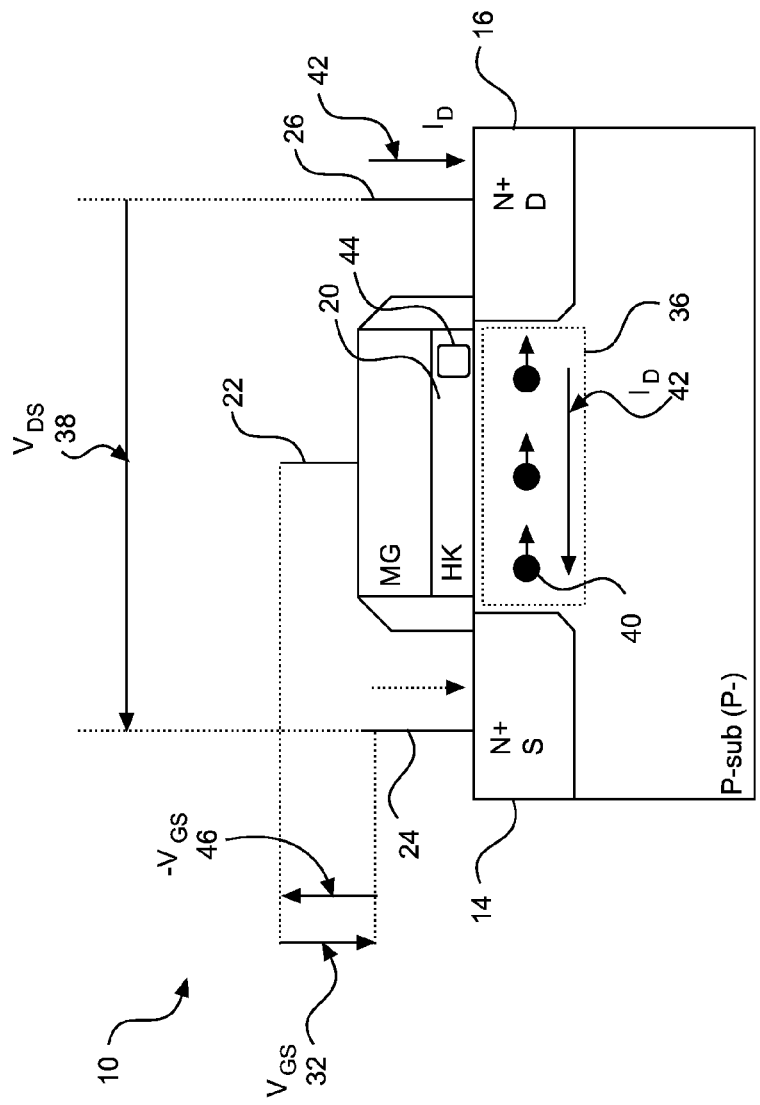
FIG. 2A is an exemplary schematic diagram illustrating a charge trap generated when the nMOSFET of FIG. 1 is programmed.
Figure 2B:
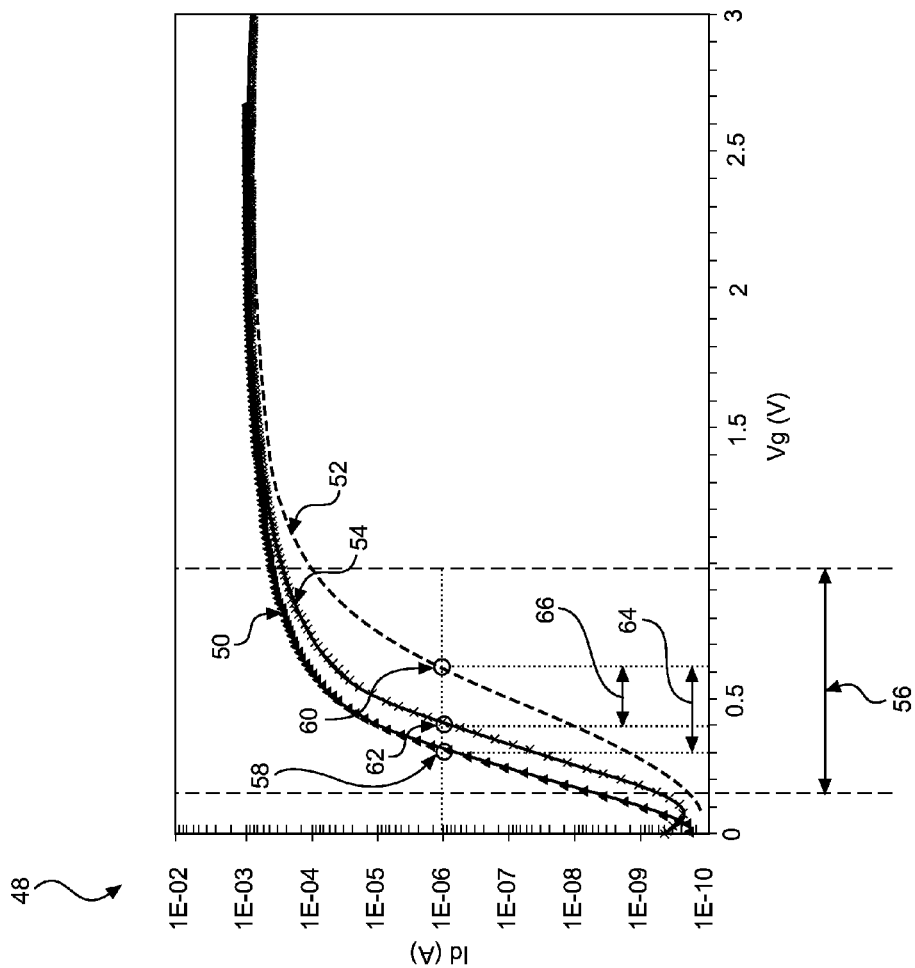
FIG. 2B is an exemplary drain-current-vs-switching-voltage ($I_D$-$V_{GS}$) curve illustrating an exemplary impact of the charge trap in FIG. 2A on the nMOSFET in FIG. 2A.
Figure 2C:
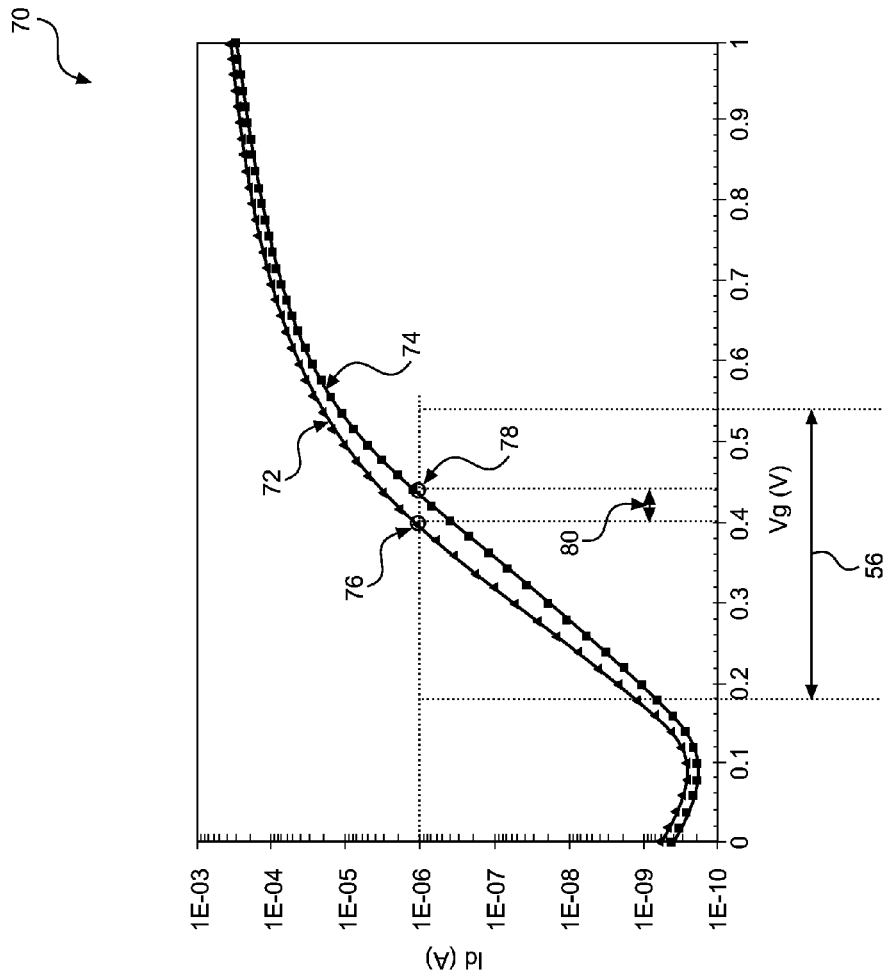
FIG. 2C is an exemplary $I_D$-$V_{GS}$ curve illustrating inconsistent voltage readings from a drain electrode and a source electrode of the nMOSFET in FIG. 2A due to the impact of the charge trap in FIG. 2A.

Before discussing examples of HK/MG MTP switching devices that are configured to eliminate a charge trap during MOSFET programming, an overview of the charge trap phenomenon in a MOSFET and effects of the charge trap are provided with reference to FIGS. 2A, 2B, and 2C. The discussion of specific exemplary aspects of the HK/MG MTP switching device starts below with reference to FIG. 3.

In this regard, FIG. 2A is a schematic diagram illustrating a charge trap 44 generated when the nMOSFET 10 of FIG. 1 is programmed. Common elements between FIG. 1 and FIG. 2A are shown with common element numbers, and thus will not be re-described herein.

With reference to FIG. 2A, when the switching voltage ($V_{GS}$) 32 is equal to or greater than the threshold voltage ($V_T$) of the nMOSFET 10, the channel region 36 of the nMOSFET 10 becomes conductive. With the presence of the drain-to-source voltage ($V_{DS}$) 38 applied between the drain electrode 26 and the source electrode 24, the electrons 40 are drawn from the n-type source region 14 to the n-type drain region 16 such that the drain current ($I_D$) 42 flows from the n-type drain region 16 to the n-type source region 14. Consequently, some of the electrons 40 (also referred to as "hot carriers") gain enough kinetic energy to enter and be trapped in the HK dielectric layer/interface layer 20, thus forming the charge trap 44 in the nMOSFET 10. The charge trap 44 reduces the switching window, which indicates a differential between a pre-switching threshold voltage and a post-switching threshold voltage, and endurance of the nMOSFET 10, thus reducing reliability in accessing information stored in the nMOSFET 10. Moreover, the charge trap 44 may remain in the HK dielectric layer/interface layer 20 for very long period of time and cannot be erased by a reverse switching voltage ($-V_{GS}$) 46.

FIG. 2B is an exemplary drain-current-vs-switching-voltage ($I_D$-$V_{GS}$) curve 48 illustrating the impact of the charge trap 44 in FIG. 2A on the nMOSFET 10 in FIG. 2A. Elements in FIG. 2A are referenced in connection with FIG. 2B and will not be re-described herein. The $I_D$-$V_{GS}$ curve 48 provides a pre-programming curve 50, a post-programming curve 52, and a post-erasing curve 54. Jointly, the pre-programming curve 50, the post-programming curve 52, and the post-erasing curve 54 illustrate a reduced switching window resulted from the charge trap 44 in the nMOSFET 10. When the switching voltage ($V_{GS}$) 32 is equal to or greater than the threshold voltage ($V_T$) applied to the nMOSFET 10 to program the nMOSFET 10, the pre-programming curve 50, which represents the pre-switching threshold voltage, shifts toward the post-programming curve 52 that represent the post-switching threshold voltage. The post-programming curve 52 is expected to return to the pre-programming curve 50 to represent the pre-switching threshold voltage when the nMOSFET 10 is erased with the reverse switching voltage ($-V_{GS}$) 46 (not shown). However, because of the charge trap 44 in the HK dielectric layer/interface layer 20, the post-programming curve 52 only returns to the post-erasing curve 54, as opposed to the pre-programming curve 50. To further explain the cause of the post-programming curve 52 not returning to the pre-programming curve 50 inside an inversion region 56, Equation 1 (Eq. 1) is provided and discussed below.

$$V_T = V_{fb} \left[ 1 + 2\psi_B + \frac{q(N_a + D_\pi + D_{ot})W_{dm}}{C_{ox}} + \frac{qD_I}{C_{ox}} \right] \quad \text{(Eq. 1)}$$

With reference to Eq. 1 above, when the nMOSFET 10 is programmed, an increase in flat-band voltage ($V_{fb}$), which is related to the inherent characteristics of the nMOSFET 10, drives the pre-programming curve 50 toward the post-programming curve 52. To facilitate the discussion, a pre-switch threshold voltage 58 on the pre-programming curve 50, a post-switch threshold voltage 60 on the post-programming curve 52, and a post-erase threshold voltage 62 on the post-erasing curve 54 are referenced herein. The rightward movement of the post-programming curve 52 causes the pre-switch threshold voltage 58 to move to the post-switch threshold voltage 60 due to the increase in the flat-band voltage (V). In an ideal situation, the flat-band voltage ($V_{fb}$) will decrease when the reverse switching voltage ($-V_{GS}$) 46 erases the nMOSFET 10, thus bringing the post-programming curve 52 back to the pre-programming curve 50 and returning the post-switch threshold voltage 60 to the pre-switch threshold voltage 58. However, due to the existence of the charge trap 44, which is represented by an oxide trap $D_{ot}$ in Eq. 1, the post-erasing curve 54 does not return all the way back to the pre-programming curve 50. As a result, the post-erase threshold voltage 62 settles in between the pre-switch threshold voltage 58 and the post-switch threshold voltage 60. Consequently, a switching window 64 of the nMOSFET 10 is shortened to a reduced switching window 66. As a result, switching endurance is shortened, thus compromising and decreasing the reliability and performance of the nMOSFET 10.

In this regard, FIG. 2C is an exemplary $I_D$-$V_{GS}$ curve 70 illustrating inconsistent voltage readings from the drain electrode 26 and the source electrode 24 of the nMOSFET 10 in FIG. 2A due to the impact of the charge trap 44 in FIG. 2A.

With reference to FIG. 2C, the $I_D$-$V_{GS}$ curve 70 comprises a drain-side-read $I_D$-$V_{GS}$ curve 72 and a source-side-read $I_D$-$V_{GS}$ curve 74. The drain-side-read $I_D$-$V_{GS}$ curve 72 illustrates threshold voltage ($V_T$) readings when a positive drain-to-source voltage ($V_{DS}$) 38 (not shown) is applied. The source-side-read $I_D$-$V_{GS}$ curve 74, on the other hand, illustrates threshold voltage ($V_T$) readings when a negative drain-to-source voltage ($V_{DS}$) 38 (not shown) is applied. The drain-side-read $I_D$-$V_{GS}$ curve 72 and the source-side-read $I_D$-$V_{GS}$ curve 74 should converge if the charge trap 44 is non-existent. However, as shown in the $I_D$-$V_{GS}$ curve 70, at any $I_D$ current level inside the inversion region 56, a drain-side-read $V_T$ 76 is different from a source-side-read $V_T$ 78. A $V_T$ differential 80 indicates a potential inaccuracy in accessing the information stored in the nMOSFET 10 due to the existence of the charge trap 44. It is thus desirable to prevent the charge trap 44 from building up in the nMOSFET 10 when the nMOSFET 10 is programmed.

Figure 3:
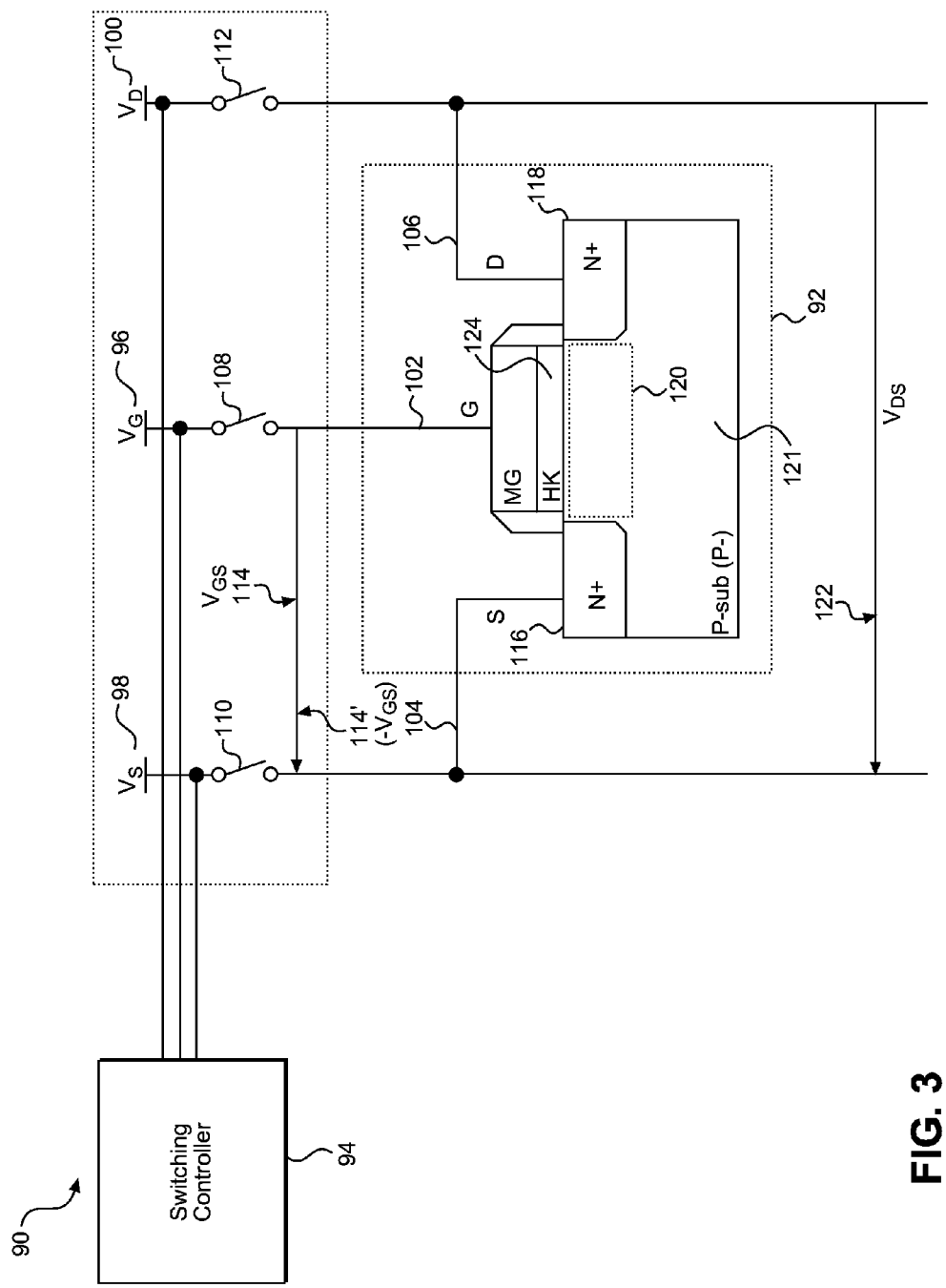
FIG. 3 is a schematic diagram of an exemplary high-k (HK)/metal gate (MG) (HK/MG) multi-time programmable (MTP) switching device configured to avoid the charge trap in FIG. 2A by preventing a channel current from being generated in the HK/MG switching device when programming the HK/MG MTP switching device.

In this regard, FIG. 3 is a schematic diagram of an exemplary HK/MG MTP switching device 90 configured to eliminate the charge trap 44 in FIG. 2A by preventing a channel current (not shown) from being generated when programming the HK/MG MTP switching device 90. The HK/MG MTP switching device 90 comprises a MOSFET 92. For the convenience of discussion, the MOSFET 92 is described hereinafter in reference to an nMOSFET. Nonetheless, the configuration and operating principles for eliminating the charge trap 44 when programming the HK/MG MTP switching device 90 are applicable to a p-channel MOSFET (pMOSFET) as well.

With reference to FIG. 3, the HK/MG MTP switching device 90 also comprises a switching controller 94. The switching controller 94 is configured to apply a gate voltage ($V_G$) 96, a source voltage ($V_S$) 98, and a drain voltage ($V_D$) 100 to a gate electrode 102, a source electrode 104, and a drain electrode 106 of the MOSFET 92, respectively. The HK/MG MTP switching device 90 also comprises a gate-side switch 108, a source-side switch 110, and a drain-side switch 112 that can be selectively opened or closed by the switching controller 94. For example, when the drain-side switch 112 is closed, the drain voltage ($V_D$) 100 is applied to the drain electrode 106. In contrast, when the drain-side switch 112 is open, the drain electrode 106 is floating. In a non-limiting example, the switching controller 94 may be integrated in a semiconductor die or integrated circuit (IC) as the MOSFET 92 is integrated.

With continuing reference to FIG. 3, when the HK/MG MTP switching device 90 is programmed to store information (e.g., binary state information), the switching controller 94 closes the gate-side switch 108 and the source-side switch 110 so that a switching voltage ($V_{GS}$) 114, which is equal to the gate voltage ($V_G$) 96 minus the source voltage ($V_S$) 98 ($V_{GS}=V_G-V_S$), is applied to the MOSFET 92. When the switching voltage ($V_{GS}$) 114 is greater than or equal to a program voltage ($V_{PG}$) (a first threshold voltage) (not shown) of the MOSFET 92, the MOSFET 92 is programmed to operate in an inversion state. In a non-limiting example, for the nMOSFET 92, the inversion state is also referred to as a first state, a program state, or a high threshold voltage state. In contrast, when the switching voltage ($V_{GS}$) 114 is less than a negative erase voltage ($-V_{ERA}$) (a second threshold voltage) (not shown) of the MOSFET 92, the MOSFET 92 is in an accumulation state. In a non-limiting example, for the nMOSFET 92, the accumulation state is also referred to as a second state, an erase state, or a low threshold voltage state.

With continuing reference to FIG. 3, while the switching voltage ($V_{GS}$) 114 is applied between the gate electrode 102 and the source electrode 104, the switching controller 94 may keep the drain electrode 106 floating by opening the drain-side switch 112. By keeping the drain electrode 106 floating, an open circuit is created between a source region 116 and a drain region 118 of the MOSFET 92. As a result, no electron movement occurs in a channel region 120, and thus no channel current flows between the source region 116 and the drain region 118 in a body 121. By eliminating the channel current between the source region 116 and the drain region 118, it is possible to prevent a charge trap (not shown) from building up in the MOSFET 92, thus ensuring access to more reliable information in the MOSFET 92.

Alternatively, instead of keeping the drain electrode 106 floating, the switching controller 94 may also configure the drain voltage ($V_D$) 100 to be the same as the source voltage ($V_S$) 98, and close the drain-side switch 112 to couple the drain voltage ($V_D$) 100 to the drain electrode 106. Because the drain voltage ($V_D$) 100 and the source voltage ($V_S$) 98 are equal, a drain-to-source voltage ($V_{DS}$) 122 applied between the drain electrode 106 and the source electrode 104 is equal to zero (0). Therefore, there is no channel current flow or electron movement in the channel region 120. By eliminating the channel current, the switching controller 94 can prevent a charge trap from being formed in an HK dielectric layer/interface layer 124 of the MOSFET 92. In both configurations, the MOSFET 92 is programmed by an electric field (not shown) generated by the switching voltage ($V_{GS}$) 114 without the channel current.

With continuing reference to FIG. 3, to erase the MOSFET 92, the switching controller 94 applies a switching voltage ($V_{GS}$) 114' equal to the negative erase voltage ($-V_{ERA}$) between the gate electrode 102 and the source electrode 104. In this regard, the switching voltage ($V_{GS}$) 114' is a reversal of the switching voltage ($V_{GS}$) 114 used to program the MOSFET 92. When the MOSFET 92 is erased, the drain electrode 106 may remain floating or coupled to the drain voltage ($V_D$) 100 having an equal voltage as the source voltage ($V_S$) 98, thus preventing a charge trap from being generated during the erasing process.

With continuing reference to FIG. 3, the gate voltage ($V_G$) 96 and the source voltage ($V_S$) 98 may be configured in various combinations to provide the switching voltage ($V_{GS}$) 114 that is equal to the program voltage ($V_{PG}$) or to provide the switching voltage ($V_{GS}$) 114' that is equal to the negative erase voltage ($-V_{ERA}$) for the MOSFET 92. The table below provides a list of such voltage combinations as a non-limiting example.

| MOSFET 92 Operation | Gate Voltage ($V_G$) 96 | Source Voltage ($V_S$) 98 | Drain Voltage (VD) 100 |
|---|---|---|---|
| Programming | $V_{PG}$ | 0 V | Floating or 0 V |
|  | ½ $V_{PG}$ | −½ $V_{PG}$ | Floating or −½ $V_{PG}$ |
|  | 3 V | 0 V | Floating or 0 V |
| Erasing | $-V_{ERA}$ | 0 V | Floating or 0 V |
|  | −½ $V_{ERA}$ | ½ $V_{ERA}$ | Floating or ½ $V_{ERA}$ |
|  | −3 V | 0 V | Floating or 0 V |

With continuing reference to FIG. 3, if the MOSFET 92 were a pMOSFET, the switching controller 94 could be configured to program the MOSFET 92 by applying the switching voltage ($V_{GS}$) 114' that is less than a negative program voltage ($-V_{PG}$) (the second threshold voltage) (not shown) between the gate electrode 102 and the source electrode 104 of the MOSFET 92. The switching controller 94 may also be configured to erase the MOSFET 92 by applying the switching voltage ($V_{GS}$) 114 that is greater than or equal to an erase voltage ($V_{ERA}$) (the first threshold voltage) (not shown) between the gate electrode 102 and the source electrode 104 of the MOSFET 92. In this regard, when the switching voltage ($V_{GS}$) 114' is less than the negative program voltage ($-V_{PG}$), the MOSFET 92 is switched to the inversion state (the second state, the erase state, or the high threshold voltage state). When the switching voltage ($V_{GS}$) 114' is greater than the erase voltage $V_{ERA}$), the MOSFET 92 is in the accumulation state (the first state, the program state, or the low threshold voltage state). Regardless, the drain electrode 106 may remain floating or coupled to the drain voltage ($V_D$) 100 having an equal voltage to the source voltage ($V_S$) 98.

Figure 4:
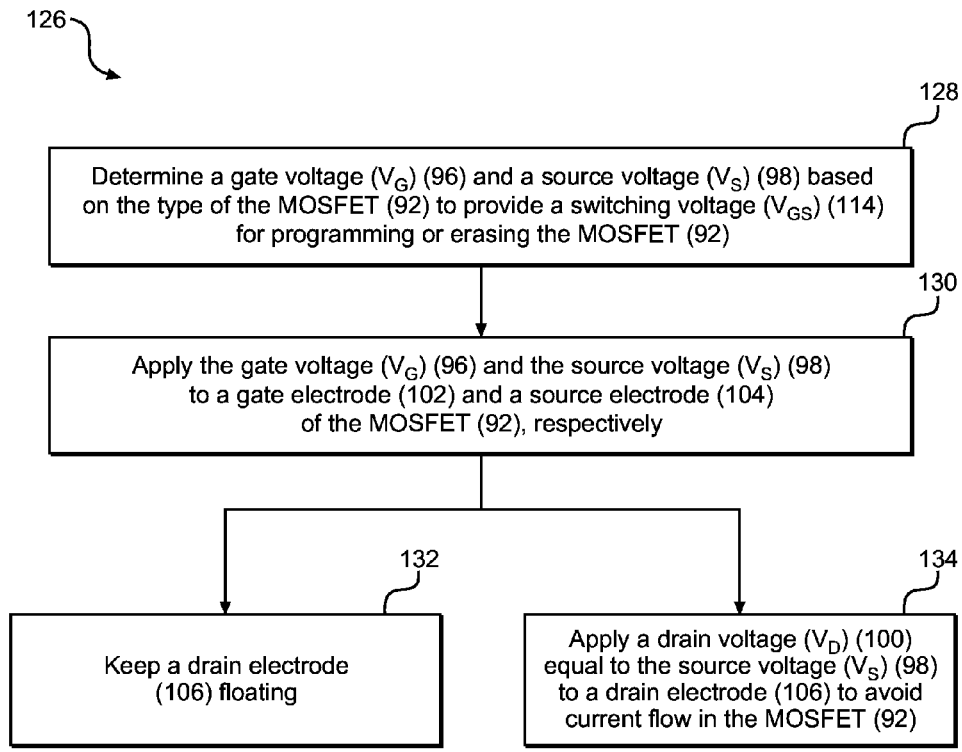
FIG. 4 is a flowchart of an exemplary programming process for preventing charge trap buildup when programming the HK/MG MTP switching device of FIG. 3.

FIG. 4 is a flowchart of an exemplary programming process 126 for preventing charge trap buildup in the MOSFET 92 in FIG. 3 when programming the HK/MG MTP switching device 90. According to the programming process 126, the switching controller 94 determines the gate voltage ($V_G$) 96 and the source voltage ($V_S$) 98 based on the type of the MOSFET 92 to provide the switching voltage ($V_{GS}$) 114 that is equal to the program voltage ($V_{PG}$) (block 128). The switching controller 94 then applies the gate voltage ($V_G$) 96 and the source voltage ($V_S$) 98 to the gate electrode 102 and the source electrode 104 of the MOSFET 92, respectively (block 130). To prevent a charge trap from building up in the MOSFET 92, the switching controller 94 can keep the drain electrode 106 floating as discussed in FIG. 3 (block 132). Alternatively, the switching controller 94 can apply the drain voltage ($V_D$) 100 equal to the source voltage ($V_S$) 98 to the drain electrode 106 to avoid current flow in the MOSFET 92 (block 134).

To validate that a charge trap can be effectively prevented when the MOSFET 92 in FIG. 3 is programmed or erased by applying equal voltages to the drain electrode 106 and the source electrode 104 or by keeping the drain electrode 106 floating, FIGS. 5-10 are provided and discussed next. Elements in FIG. 3 are referenced in connection to FIGS. 5-10 and will not be re-described herein.

Figure 5:
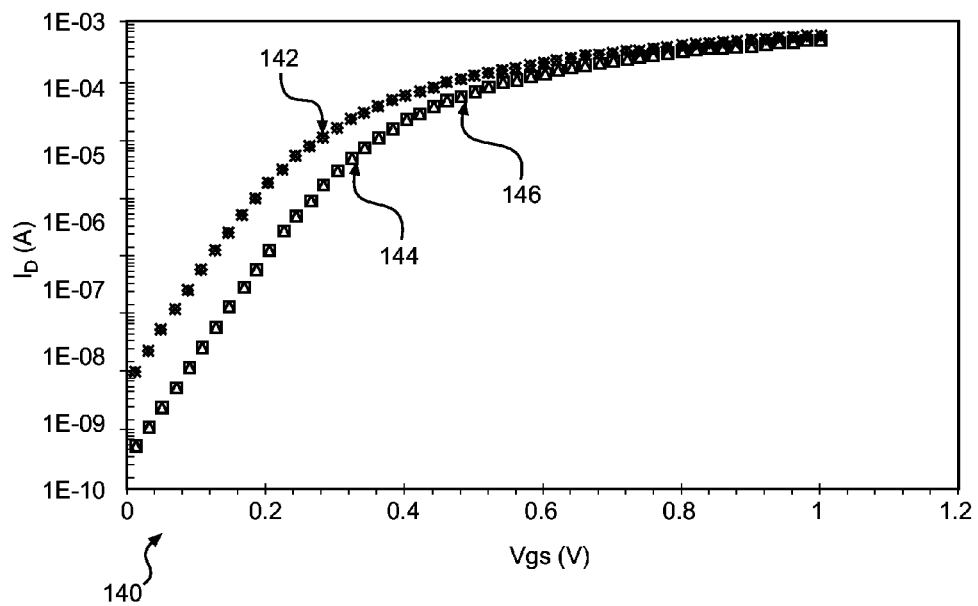
FIG. 5 is a plot of an exemplary forward-sweep and reverse-sweep $I_D$-$V_{GS}$ curve that graphically validates the charge trap prevention configuration for the HK/MG MTP switching device in FIG. 3 when the MOSFET in the HK/MG MTP switching device is programmed.

In this regard, FIG. 5 is a plot of an exemplary forward-sweep and reverse-sweep $I_D$-$V_{GS}$ curve 140 that graphically validates the charge trap prevention configuration for the HK/MG MTP switching device 90 when the MOSFET 92 in the HK/MG MTP switching device 90 is programmed. The forward-sweep and reverse-sweep $I_D$-$V_{GS}$ curve 140 comprises a pre-programming $I_D$-$V_{GS}$ curve 142, a post-programming forward-sweep $I_D$-$V_{GS}$ curve 144, and a post-programming reverse-sweep $I_D$-$V_{GS}$ curve 146. When the switching voltage ($V_{GS}$) 114 is applied to the MOSFET 92, the pre-programming $I_D$-$V_{GS}$ curve 142 shifts toward to the post-programming forward-sweep $I_D$-$V_{GS}$ curve 144. As discussed earlier with reference to Eq. 1, the rightward shift of the pre-programming $I_D$-$V_{GS}$ curve 142 is due to changes of the flat-band voltage ($V_p$). To generate the post-programming reverse-sweep $I_D$-$V_{GS}$ curve 146, the switching voltage ($V_{GS}$) 114 is applied between the gate electrode 102 and the drain electrode 106. Understandably from previous discussions, the post-programming reverse-sweep $I_D$-$V_{GS}$ curve 146 would not be properly aligned with the post-programming forward-sweep $I_D$-$V_{GS}$ curve 144 if a charge trap had existed in the MOSFET 92. Hence, by illustrating a good alignment between the post-programming forward-sweep $I_D$-$V_{GS}$ curve 144 and the post-programming reverse-sweep $I_D$-$V_{GS}$ curve 146, the forward-sweep and reverse-sweep $I_D$-$V_{GS}$ curve 140 proves that the charge trap prevention configuration described in FIG. 3 is effective.

Figure 6:
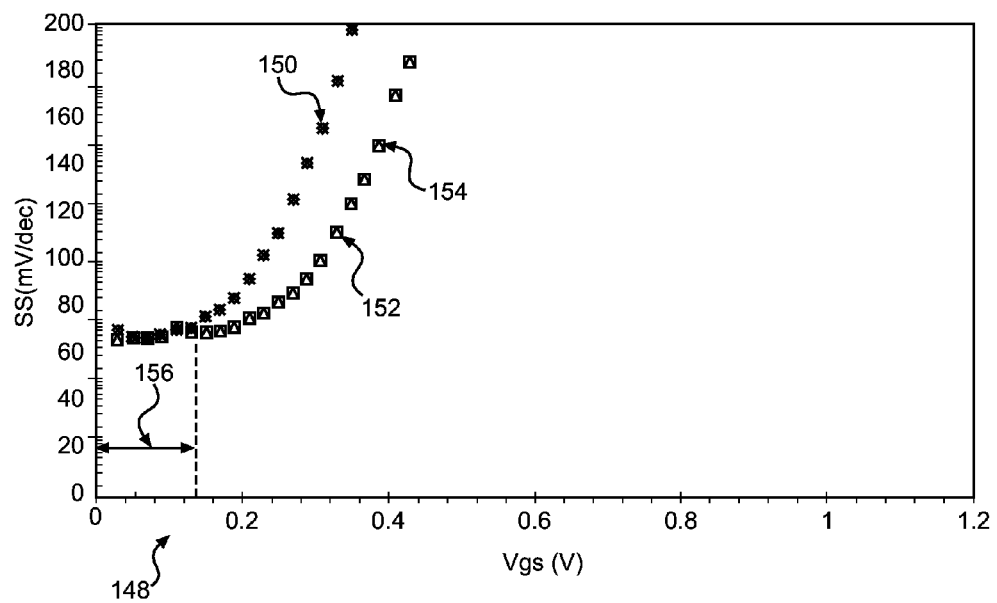
FIG. 6 is a plot of an exemplary sub-threshold slop (SS) curve that graphically validates the charge trap prevention configuration for the HK/MG MTP switching device in FIG. 3 when the MOSFET in the HK/MG MTP switching device is programmed.

FIG. 6 is a plot of an exemplary sub-threshold slop (SS) curve 148 that graphically validates the charge trap prevention configuration for the HK/MG MTP switching device 90 when the MOSFET 92 in the HK/MG MTP switching device 90 is programmed. The sub-threshold slop (SS) curve 148 illustrates a pre-programming SS curve 150, a post-programming forward-sweep SS curve 152, and a post-programming reverse-sweep SS curve 154 that correspond to the pre-programming $I_D$-$V_{GS}$ curve 142, the post-programming forward-sweep $I_D$-$V_{GS}$ curve 144, and the post-programming reverse-sweep $I_D$-$V_{GS}$ curve 146 in FIG. 5, respectively. As illustrated in the sub-threshold slop (SS) curve 148, the pre-programming SS curve 150, the post-programming forward-sweep SS curve 152, and the post-programming reverse-sweep SS curve 154 are in good agreement in a sub-threshold region 156, wherein the switching voltage ($V_{GS}$) 114 is below the threshold voltage ($V_T$). By showing good agreement in the sub-threshold region 156, the sub-threshold slop (SS) curve 148 also proves that the charge trap prevention configuration described in FIG. 3 is effective.

Figure 7:
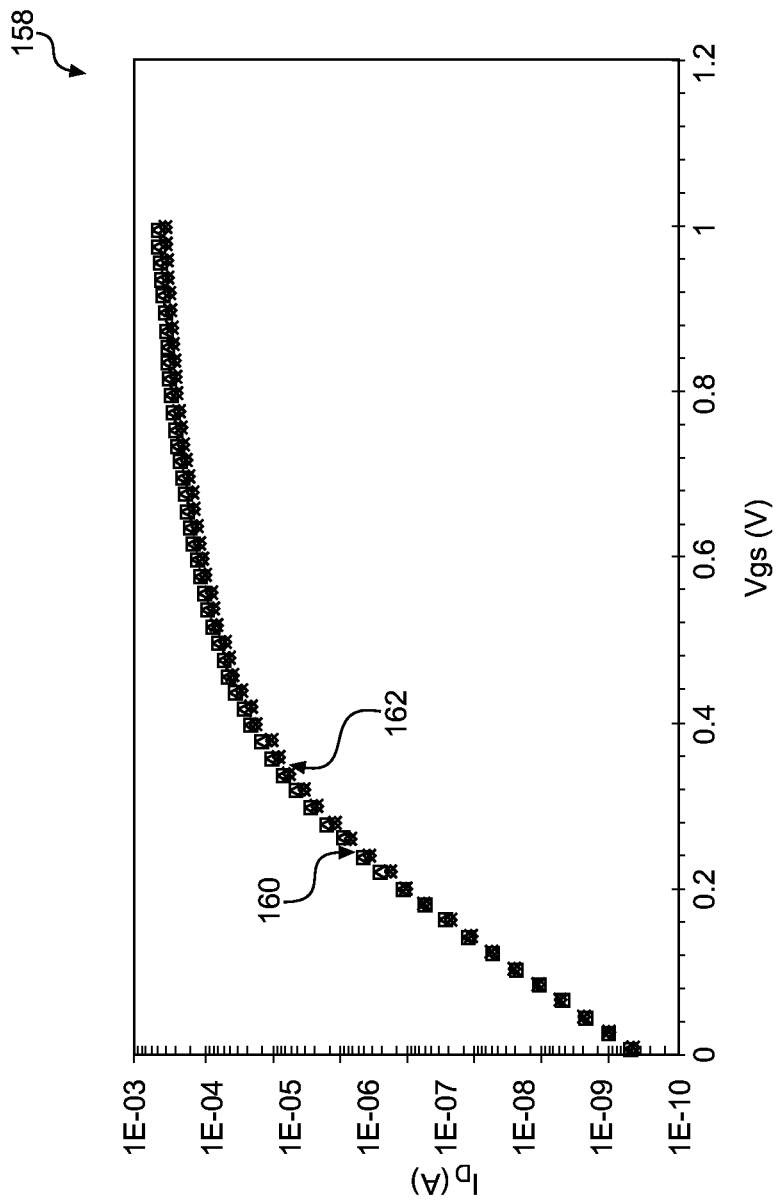
FIG. 7 is a plot of an exemplary drain-side-read and source-side-read $I_D$-$V_{GS}$ curve that graphically validates the charge trap prevention configuration for the HK/MG MTP switching device in FIG. 3 when the MOSFET in the HK/MG MTP switching device is programmed.

FIG. 7 is a plot of an exemplary drain-side-read and source-side-read $I_D$-$V_{GS}$ curve 158 that graphically validates the charge trap prevention configuration for the HK/MG MTP switching device 90 when the MOSFET 92 in the HK/MG MTP switching device 90 is programmed. The drain-side-read and source-side-read $I_D$-$V_{GS}$ curve 158 comprises a drain-side-read $I_D$-$V_{GS}$ curve 160 and a source-side-read $I_D$-$V_{GS}$ curve 162. According to earlier discussions with reference to FIG. 2B, the drain-side-read $I_D$-$V_{GS}$ curve 160 and the source-side-read $I_D$-$V_{GS}$ curve 162 would not be in good agreement if a charge trap had existed in the MOSFET 92. Hence, by illustrating a good agreement between the drain-side-read $I_D$-$V_{GS}$ curve 160 and the source-side-read $I_D$-$V_{GS}$ curve 162, the drain-side-read and source-side-read $I_D$-$V_{GS}$ curve 158 further proves that the charge trap prevention configuration described in FIG. 3 is effective.

Figure 8:
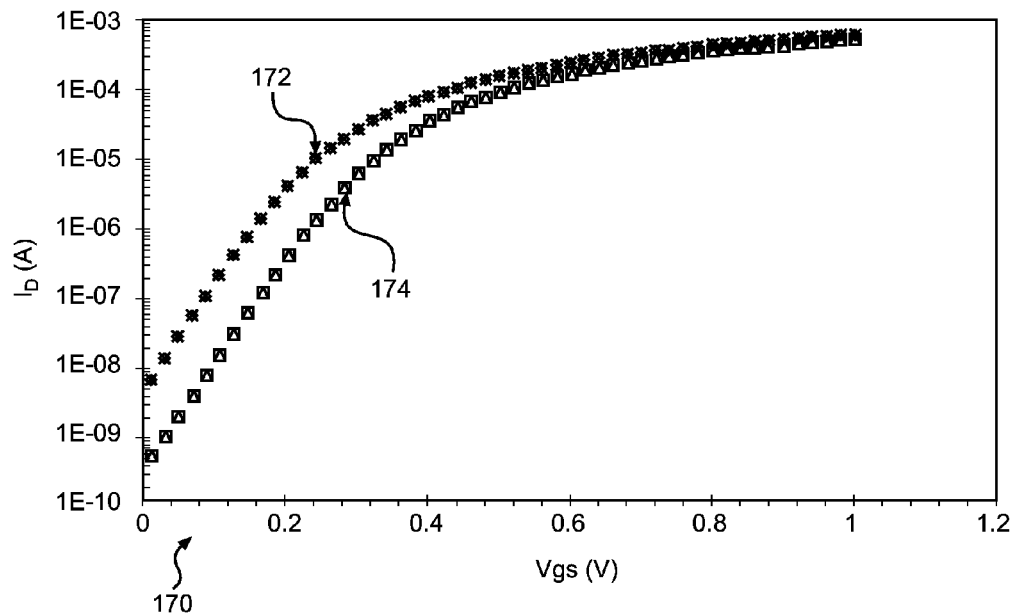
FIG. 8 is a plot of an exemplary pre-programming post-erasing $I_D$-$V_{GS}$ curve that graphically validates the charge trap prevention configuration for the HK/MG MTP switching device in FIG. 3 when the MOSFET in the HK/MG MTP switching device is erased.

As previously discussed in the $I_D$-$V_{GS}$ curve 48 in FIG. 2B above, when the nMOSFET 10 in FIG. 2A is erased, the post-programming curve 52 only returns to the post-erasing curve 54 as opposed to returning all the way to the pre-programming curve 50 due to existence of the charge trap 44. In this regard, FIG. 8 is a plot of an exemplary pre-programming post-erasing $I_D$-$V_{GS}$ curve 170 that graphically validates the charge trap prevention configuration for the HK/MG MTP switching device 90 when the MOSFET 92 in the HK/MG MTP switching device 90 is erased. The pre-programming post-erasing $I_D$-$V_{GS}$ curve 170 comprises a pre-programming curve 172 and a post-erasing curve 174. In contrast to the post-erasing curve 54 in FIG. 2B, which did not return all the way back to the pre-programming curve 50 due to the existence of the charge trap 44, the post-erasing curve 174 is in good alignment with the pre-programming curve 172 after the MOSFET 92 is erased. This further proves that the charge trap prevention configuration described in FIG. 3 is effective.

Figure 9:
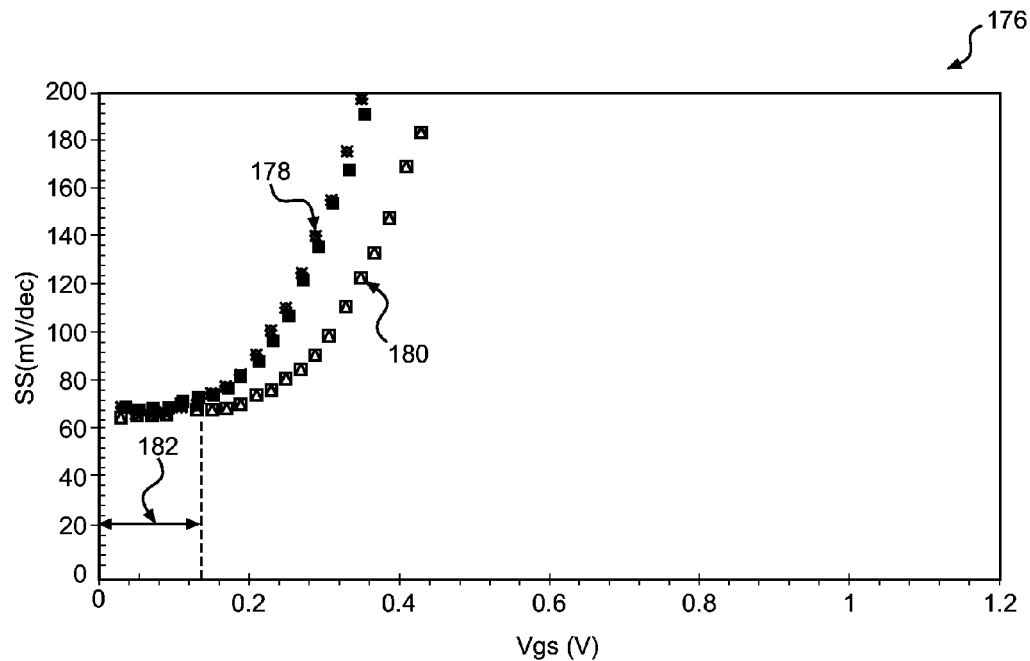
FIG. 9 is a plot of an exemplary SS curve that graphically validates the charge trap prevention configuration for the HK/MG MTP switching device in FIG. 3 when the MOSFET in the HK/MG MTP switching device is erased.

FIG. 9 is a plot of an exemplary SS curve 176 that graphically validates the charge trap prevention configuration for the HK/MG MTP switching device 90 when the MOSFET 92 in the HK/MG MTP switching device 90 is erased. The SS curve 176 comprises a pre-programming SS curve and post-erasing curve 178 and a post-programming curve and pre-erasing curve 180. The pre-programming SS curve and post-erasing curve 178 and the post-programming curve and pre-erasing curve 180 show good agreements in a pre-threshold region 182, further proving that the charge trap prevention configuration described in FIG. 3 is effective.

Figure 10:
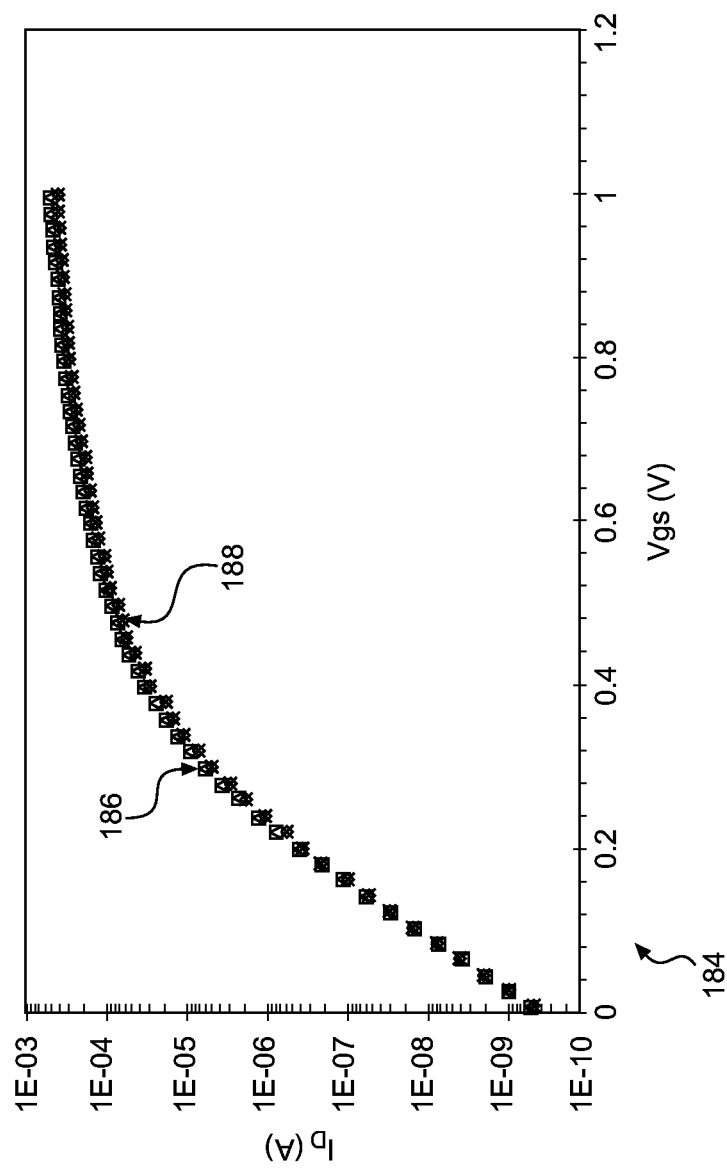
FIG. 10 is a plot of an exemplary drain-side-read and source-side-read $I_D$-$V_{GS}$ curve that graphically validates the charge trap prevention configuration for the HK/MG MTP switching device in FIG. 3 when the MOSFET in the HK/MG MTP switching device is erased.

FIG. 10 is a plot of an exemplary drain-side-read and source-side-read $I_D$-$V_{GS}$ curve 184 that graphically validates the charge trap prevention configuration for the HK/MG MTP switching device 90 when the MOSFET 92 in the HK/MG MTP switching device 90 is erased. The drain-side-read and source-side-read $I_D$-$V_{GS}$ curve 184 comprises a post-erasing drain-side-read $I_D$-$V_{GS}$ curve 186 and a post-erasing source-side-read $I_D$-$V_{GS}$ curve 188. In contrast to the drain-side-read $I_D$-$V_{GS}$ curve 72 and the source-side-read $I_D$-$V_{GS}$ curve 74 in FIG. 2B that are in disagreement, the post-erasing drain-side-read $I_D$-$V_{GS}$ curve 186 and the post-erasing source-side-read $I_D$-$V_{GS}$ curve 188 are in good agreement with each other. Therefore, the charge trap prevention configuration described in FIG. 3 is proven to be effective.

Figure 11:
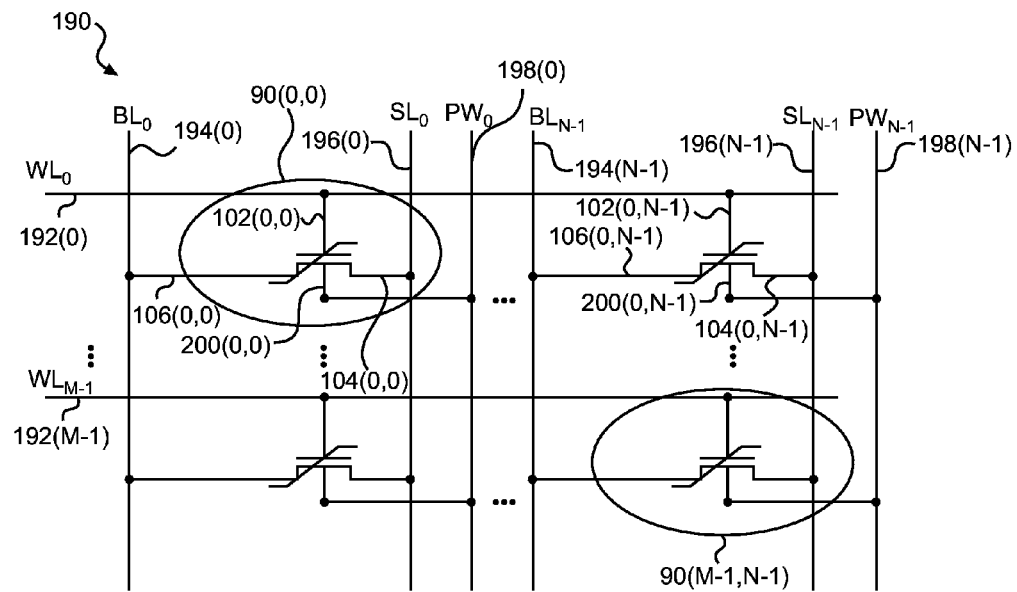
FIG. 11 is a schematic diagram of an exemplary memory array comprised of a plurality of HK/MG MTP switching devices arranged in M rows by N columns (M×N) to provide an M×N HK/MG MTP switching device.

Because of the inherent ability of the HK/MG MTP switching device 90 of FIG. 3 to be MTP to store binary information, a plurality of HK/MG MTP switching devices 90 may be configured to form a memory array. In a non-limiting example, the plurality of HK/MG MTP switching devices 90 may comprise a plurality of MOSFETs (e.g., a plurality of nMOSFETs or a plurality of pMOSFETs). In this regard, FIG. 11 is an exemplary schematic diagram illustrating a plurality of HK/MG MTP switching devices 90 configured to form an M rows by N columns (M×N) MTP switching device memory array 190. In this regard, the M×N MTP switching device memory array 190 comprises M×N switching device memory cells 90($x,y$), wherein ($0 \leq x \leq M-1$) and ($0 \leq y \leq N-1$). For example, M×N switching device memory cell 90(0,0) is located at the junction of row 0 and column 0, M×N switching device memory cell 90(0,N−1) is located at the junction of row 0 and column N−1, M×N switching device memory cell 90(M−1,0) is located at the junction of row M−1 and column 0, and so on.

With reference to FIG. 11, the M×N MTP switching device memory array 190 comprises M word lines (WLs) 192(0)-192(M−1). Each of the M WLs 192(0)-192(M−1) is coupled to N switching device memory cells 90($x,y$) in a respective row in the M×N MTP switching device memory array 190. For example, the WL 192(0) is coupled to the N switching device memory cells 90(0,0)-90(0,N−1) in row 0, the WL 192(M−1) is coupled to the N switching device memory cells 90(M−1,0)-90(M−1,N−1) in row M−1, and so on. Specifically, each of the M WLs 192(0)-192(M−1) is coupled to N gate electrodes 102($x,y$) of the N switching device memory cells 90($x,y$) in the respective row. For example, the WL 192(0) is coupled to N gate electrodes 102(0,0)-102(0,N−1) of the N switching device memory cells 90(0,0)-90(0,N−1) in row 0, the WL 192(M−1) is coupled to N gate electrodes 102(M−1,0)-102(M−1,N−1) of the N switching device memory cells 90(M−1,0)-90(M−1,N−1) in row M−1, and so on.

With continuing reference to FIG. 11, the M×N MTP switching device memory array 190 also comprises N bit lines (BLs) 194(0)-194(N−1). Each of the N BLs 194(0)-192(N−1) is coupled to M switching device memory cells 90($x,y$) in a respective column in the M×N MTP switching device memory array 190. For example, the BL 194(0) is coupled to the M switching device memory cells 90(0,0)-90(M−1,0) in column 0, the BL 194(N−1) is coupled to the M switching device memory cells 90(0,N−1)-90(M−1,N−1) in column N−1, and so on. Specifically, each of the N BLs 194(0)-194(N−1) is coupled to M drain electrodes 106($x,y$) of the M switching device memory cells 90($x,y$) in the respective column. For example, the BL 194(0) is coupled to M drain electrodes 106(0,0)-106(M−1,0) of the M switching device memory cells 90(0,0)-90(M−1,0) in column 0, the BL 194(N−1) is coupled to M drain electrodes 106(0,N−1)-106(M−1,N−1) of the M switching device memory cells 90(0,N−1)-90(M−1,N−1) in column N−1, and so on.

With continuing reference to FIG. 11, the M×N MTP switching device memory array 190 also comprises N source lines (SLs) 196(0)-196(N−1). Each of the N SLs 196(0)-196(N−1) is coupled to the M switching device memory cells 90($x,y$) in a respective column in the M×N MTP switching device memory array 190. For example, the SL 196(0) is coupled to the M switching device memory cells 90(0,0)-90(M−1,0) in column 0, the SL 196(N−1) is coupled to the M switching device memory cells 90(0,N−1)-90(M−1,N−1) in column N−1, and so on. Specifically, each of the N SLs 196(0)-196(N−1) is coupled to M source electrodes 104($x,y$) of the M switching device memory cells 90($x,y$) in the respective column. For example, the SL 196(0) is coupled to M source electrodes 104(0,0)-104(M−1,0) of the M switching device memory cells 90(0,0)-90(M−1,0) in column 0, the SL 196(N−1) is coupled to M source electrodes 104(0,N−1)-104(M−1,N−1) of the M switching device memory cells 90(0,N−1)-90(M−1,N−1) in column N−1, and so on.

With continuing reference to FIG. 11, the M×N MTP switching device memory array 190 also comprises N P-wells (PWs) 198(0)-198(N−1). Each of the N PWs 198(0)-198(N−1) is coupled to the M switching device memory cells 90($x,y$) in a respective column in the M×N MTP switching device memory array 190. For example, the PW 198(0) is coupled to the M switching device memory cells 90(0,0)-90(M−1,0) in column 0, the PW 198(N−1) is coupled to the M switching device memory cells 90(0,N−1)-90(M−1,N−1) in column N−1, and so on. Specifically, each of the N PWs 198(0)-198(N−1) is coupled to M bodies 200($x,y$) of the M switching device memory cells 90($x,y$) in the respective column. For example, the PW 198(0) is coupled to M bodies 200(0,0)-200(M−1,0) of the M switching device memory cells 90(0,0)-90(M−1,0) in column 0, the PW 198(N−1) is coupled to M bodies 200(0,N−1)-200(M−1,N−1) of the M switching device memory cells 90(0,N−1)-90(M−1,N−1) in column N−1, and so on. The N PWs 198(0)-198(N−1) are configured to be a ground (GND) (not shown) of the M×N MTP switching device memory array 190.

For the convenience of discussion, the switching device memory cell 90(0,0), which is located at row 0 and column 0 of the M×N MTP switching device memory array 190, is referenced hereinafter as a non-limiting example. Understandably, the configuration and operation principles discussed with reference to the switching device memory cell 90(0,0) are generally applicable to any of the switching device memory cells 90(0,0)-90(M−1,N−1) in the M×N MTP switching device memory array 190.

To properly program the switching device memory cell 90(0,0), for example, a memory controller (not shown) must make sure no charge trap is generated in the switching device memory cell 90(0,0). Furthermore, the memory controller must also ensure that other switching device memory cells, particularly those switching device memory cells coupled to the same row or the same column as the switching device memory cell 90(0,0), are not accidentally programmed.

Figure 12:
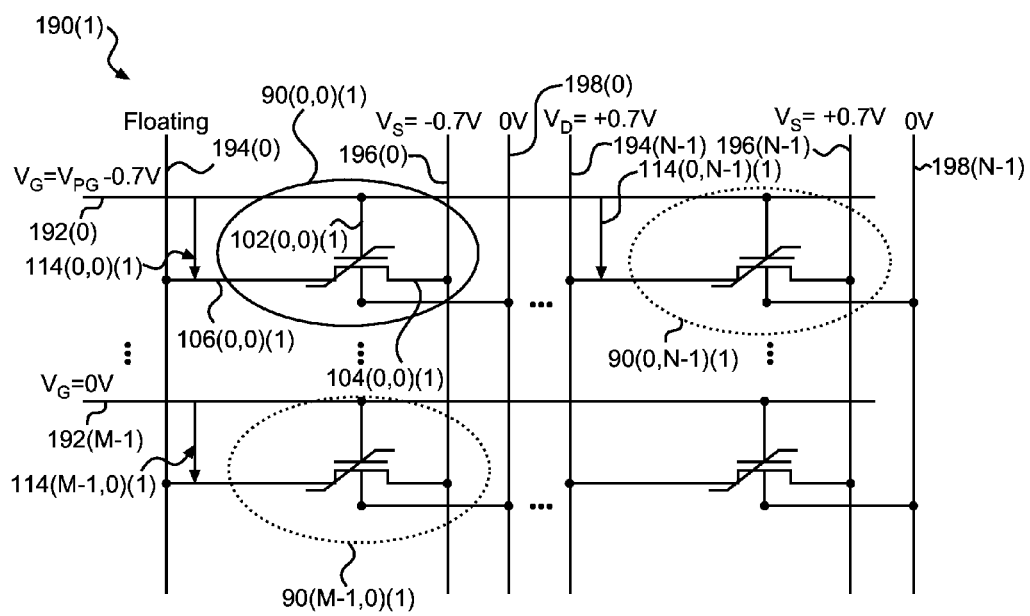
FIG. 12 is a schematic diagram of an exemplary M×N HK/MG MTP switching device memory array arranged according to the M×N HK/MG MTP switching device memory array of FIG. 11 to program a selected switching device memory cell without generating charge traps by keeping a drain electrode of the selected switching device memory cell floating.

In this regard, FIG. 12 is a schematic diagram of an exemplary M×N MTP switching device memory array 190(1) arranged according to the M×N MTP switching device memory array 190 of FIG. 11 to program a selected switching device memory cell 90(0,0)(1) without generating charge traps by keeping a drain electrode 106(0,0)(1) of the selected switching device memory cell 90(0,0)(1) floating. Common elements between FIG. 11 and FIG. 12 are shown with common element numbers, and thus will not be re-described herein.

With reference to FIG. 12, to program the selected switching device memory cell 90(0,0)(1) located in row 0 and column 0 of the M×N MTP switching device memory array 190(1), the memory controller (not shown) keeps the BL 194(0) floating while applying $V_G = (V_{PG} - 0.7V)$ and $V_S = (-0.7V)$ to the WL 192(0) and the SL 196(0), respectively. To prevent other switching device memory cells in the column 0 from being accidentally programmed, the memory controller applies $V_G = 0V$ to the rest of M−1 WLs 192(1)-192(M−1). Furthermore, to prevent other switching device memory cells in the row 0 from being accidentally programmed, the memory controller applies $V_D = 0.7V$ to the rest of N−1 BLs 194(1)-194(N−1) and $V_S = 0.7V$ to the rest of N−1 SLs 196(1)-196(N−1). In this regard, a switching voltage ($V_{GS}$) 114(0,0)(1) applied to the selected switching device memory cell 90(0,0)(1) is equal to the program voltage ($V_{PG}$) ($V_{GS} = V_G - $ $V_S=(V_{PG}-0.7V)-(-0.7V)=V_{PG}$), thus causing the selected switching device memory cell 90(0,0)(1) to be programmed. Further, no charge trap is generated in the selected switching device memory cell 90(0,0)(1) because the drain electrode 106(0,0)(1) of the selected switching device memory cell 90(0,0)(1) is kept floating by coupling to the WL 192(0).

With continuing reference to FIG. 12, for switching device memory cells 90(1,0)(1)-90(M−1,0)(1) that are coupled to the BL 194(0) and the SL 196(0), the respective switching voltages ($V_{GS}$) 114(1,0)(1)-114(M−1,0)(1) are equal to 0.7V ($V_{GS}=V_G-V_S=0V-(-0.7V)=0.7V$). As a result, none of the switching device memory cells 90(1,0)(1)-90(M−1,0)(1) can be accidentally programmed. For switching device memory cells 90(0,1)(1)-90(0,N−1)(1) that are coupled to the WL 192(0), switching voltages ($V_{GS}$) 114(0,1)(1)-114(0,N−1)(1) for the switching device memory cells 90(0,1)(1)-90(0,N−1)(1) are all equal to $V_{PG}$ minus 1.4V ($V_{GS}=V_G-V_S=(V_{PG}-0.7V)-0.7V=V_{PG}-1.4V$). As a result, none of the switching device memory cells 90(0,1)(1)-90(0,N−1)(1) can be accidentally programmed either. For the rest of the switching device memory cells 90(1,1)(1)-90(M−1,N−1)(1) that are not coupled to the WL 192(0), the BL 194(0), and the SL 196(0), switching voltages ($V_{GS}$) 114(1,1)(1)-114(M−1,N−1)(1) are all equal to −0.7V ($V_{GS}=V_G-V_S=0V-0.7V=-0.7V$). As a result, none of the switching device memory cells 90(1,1)(1)-90(M−1,N−1)(1) can be accidentally programmed.

Figure 13:
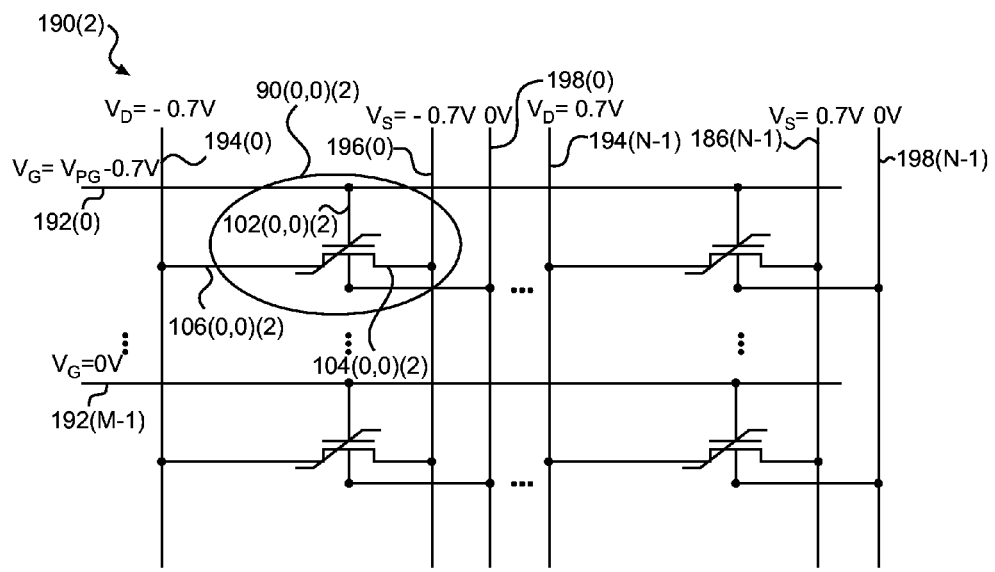
FIG. 13 is a schematic diagram of an exemplary M×N HK/MG MTP switching device memory array arranged according to the M×N HK/MG MTP switching device memory array of FIG. 11 to program a selected switching device memory cell without generating charge traps by applying equal voltages to a source electrode and a drain electrode of the selected switching device memory cell.

FIG. 13 is a schematic diagram of an exemplary M×N MTP switching device memory array 190(2) arranged according to the M×N MTP switching device memory array 190 of FIG. 11 to program a selected switching device memory cell 90(0,0)(2) without generating charge traps by applying equal voltages to a source electrode 104(0,0)(2) and a drain electrode 106(0,0)(2) of the selected switching device memory cell 90(0,0)(2). Common elements between FIG. 11 and FIG. 13 are shown with common element numbers, and thus will not be re-described herein.

With reference to FIG. 13, to program the selected switching device memory cell 90(0,0)(2) without generating a charge trap, a memory controller (not shown) is configured to apply a $V_D=-0.7V$ to the BL 194(0) instead of keeping the BL 194(0) floating as in FIG. 12. As a result, the BL 194(0) and the SL 196(0) have the same voltages, thus preventing a charge trap buildup when the selected switching device memory cell 90(0,0)(2) is programmed. Further, no other switching device memory cells in the M×N MTP switching device memory array 190(2) can be accidentally programmed according to earlier discussions in FIG. 12.

Figure 14:
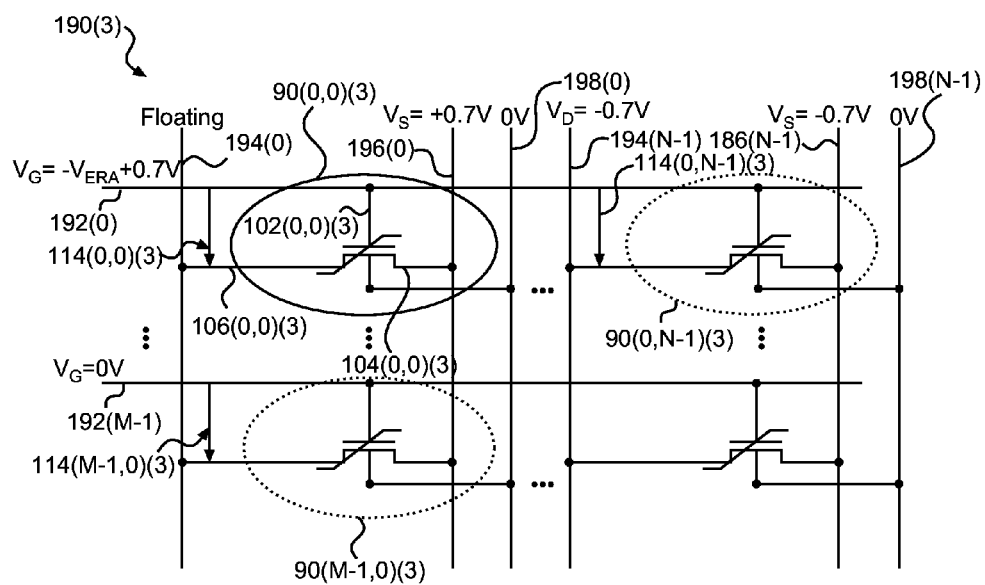
FIG. 14 is a schematic diagram of an exemplary M×N HK/MG MTP switching device memory array arranged according to the M×N HK/MG MTP switching device memory array of FIG. 11 to erase a selected switching device memory cell without generating charge traps by keeping a drain electrode of the selected switching device memory cell floating.

FIG. 14 is a schematic diagram of an exemplary M×N MTP switching device memory array 190(3) arranged according to the M×N MTP switching device memory array 190 of FIG. 11 to erase a selected switching device memory cell 90(0,0)(3) without generating charge traps by keeping a drain electrode 106(0,0)(3) of the selected switching device memory cell 90(0,0)(3) floating. Common elements between FIG. 11 and FIG. 14 are shown with common element numbers, and thus will not be re-described herein.

With reference to FIG. 14, to erase the selected switching device memory cell 90(0,0)(3) located in row 0 and column 0 of the M×N MTP switching device memory array 190(3), a memory controller (not shown) keeps the BL 194(0) floating while applying $V_G=(-V_{ERA}+0.7V)$ and $V_S=(0.7V)$ to the WL 192(0) and the SL 196(0), respectively. To prevent other switching device memory cells 90(1,0)(3)-90(M−1,0)(3) in column 0 from being accidentally erased, the memory controller applies $V_G=0V$ to the rest of M−1 WLs 192(1)-192(M−1). Furthermore, to prevent other switching device memory cells 90(0,1)(3)-90(0,N−1)(3) in row 0 from being accidentally programmed, the memory controller applies $V_D=-0.7V$ to the rest of N−1 BLs 194(1)-194(N−1) and $V_S=-0.7V$ to the rest of N−1 SLs 196(1)-196(N−1). In this regard, the switching voltage ($V_{GS}$) 114(0,0)(3) applied to the selected switching device memory cell 90(0,0)(3) is equal to $-V_{ERA}$ ($V_{GS}=V_G-V_S=(-V_{ERA}+0.7V)-(0.7V)=-V_{ERA}$), thus causing the selected switching device memory cell 90(0,0)(3) to be erased.

With continuing reference to FIG. 14, for the switching device memory cells 90(1,0)(3)-90(M−1,0)(3) that are coupled to the BL 194(0) and the SL 196(0), respective switching voltages ($V_{GS}$) 114(1,0)(3)-114(M−1,0)(3) are equal to −0.7V ($V_{GS}=V_G-V_S=0V-(0.7V)=-0.7V$). As a result, none of the switching device memory cells 90(1,0)(3)-90(M−1,0)(3) can be accidentally erased. For the switching device memory cells 90(0,1)(3)-90(0,N−1)(3) that are coupled to the WL 192(0), switching voltages ($V_{GS}$) 114(0,1)(3)-114(0,N−1)(3) for the switching device memory cells 90(0,1)(3)-90(0,N−1)(3) are all equal to $-V_{ERA}+1.4V$ ($V_{GS}=V_G-V_S=(-V_{ERA}+0.7V)-(-0.7V)=-V_{ERA}+1.4V$). As a result, none of the switching device memory cells 90(0,1)(3)-90(0,N−1)(3) can be accidentally erased either. For the rest of the switching device memory cells 90(1,1)(3)-90(M−1,N−1)(3) that are not coupled to the WL 192(0), the BL 194(0), and the SL 196(0), switching voltages ($V_{GS}$) 114(1,1)(3)-114(M−1,N−1)(3) are all equal to 0.7V ($V_{GS}=V_G-V_S=0V-(-0.7V)=0.7V$). As a result, none of the switching device memory cells 90(1,1)(3)-90(M−1,N−1)(3) can be accidentally erased as well.

Figure 15:
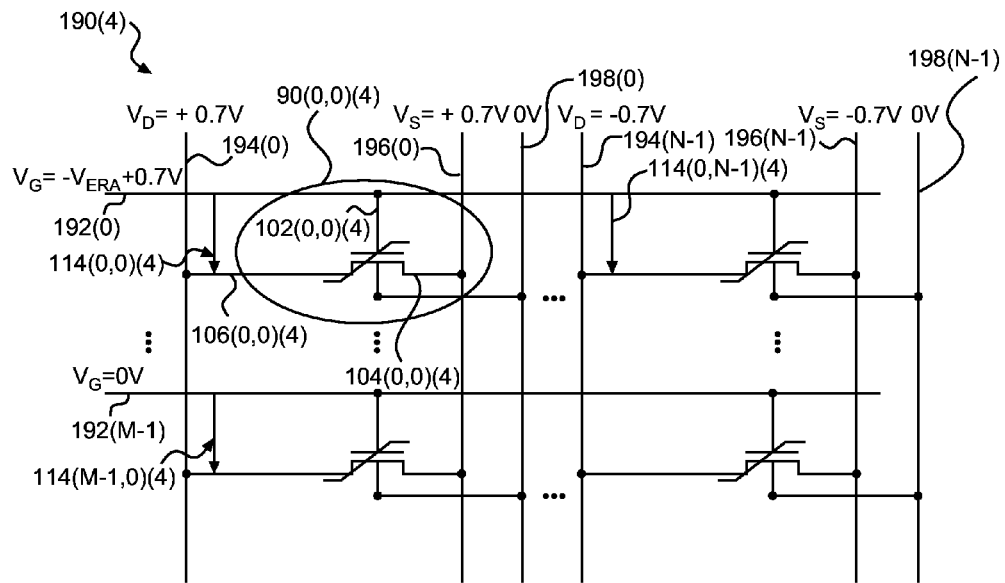
FIG. 15 is a schematic diagram of an exemplary M×N HK/MG MTP switching device memory array arranged according to the M×N HK/MG MTP switching device memory array of FIG. 11 to erase a selected switching device memory cell without generating charge traps by applying equal voltages to a source electrode and a drain electrode of the selected switching device memory cell.

FIG. 15 is a schematic diagram of an exemplary M×N MTP switching device memory array 190(4) arranged according to the M×N MTP switching device memory array 190 of FIG. 11 to erase a selected switching device memory cell 90(0,0)(4) without generating charge traps by applying equal voltages to a source electrode 104(0,0)(4) and a drain electrode 106(0,0)(4) of the selected switching device memory cell 90(0,0,)(4). Common elements between FIG. 11 and FIG. 15 are shown with common element numbers, and thus will not be re-described herein.

With reference to FIG. 15, to erase the selected switching device memory cell 90(0,0)(4), a memory controller (not shown) applies $V_G=(-V_{ERA}+0.7V)$, $V_D=(0.7V)$, and $V_S=(0.7V)$ to the WL 192(0), the BL 194(0), and the SL 196(0), respectively. To prevent other switching device memory cells 90(1,0)(4)-90(M−1,0)(4) in column 0 from being accidentally erased, the memory controller applies $V_G=0V$ to the rest of the M−1 WLs 192(1)-192(M−1). Furthermore, to prevent other switching device memory cells 90(0,1)(4)-90(0,N−1)(4) in row 0 from being accidentally erased, the memory controller applies $V_D=-0.7V$ to the rest of N−1 BLs 194(1)-194(N−1) and $V_S=-0.7V$ to the rest of N−1 SLs 196(1)-196(N−1). In this regard, the switching voltage ($V_{GS}$) 114(0,0)(4) applied to the selected switching device memory cell 90(0,0)(4) is equal to a negative threshold voltage ($-V_T$) ($V_{GS}=V_G-V_S=(-V_T+0.7V)-(0.7V)=-V_T$), thus causing the selected switching device memory cell 90(0,0)(4) to be erased.

With continuing reference to FIG. 15, for the switching device memory cells 90(1,0)(4)-90(M−1,0)(4) that are coupled to the BL 194(0) and the SL 196(0), the switching voltages ($V_{GS}$) 114(1,0)(4)-114(M−1,0)(4) are equal to −0.7V ($V_{GS}=V_G-V_S=0V-(0.7V)=-0.7V$). As a result, none of the switching device memory cells 90(1,0)(4)-90(M−1,0)(4) can be accidentally erased. For the switching device memory cells 90(0,1)(4)-90(0,N−1)(4) that are coupled to the WL 192(0), the switching voltages ($V_{GS}$) 114(0,1)(4)-114(0,N−1)(4) for the switching device memory cells 90(0,1)-90(0,N−1) are all equal to $-V_{ERA}+1.4V$ ($V_{GS}=V_G-V_S=(-V_{ERA}+$ 0.7V)−(−0.7V)=−$V_{ERA}$+1.4V). As a result, none of the switching device memory cells 90(0,1)(4)-90(0,N−1)(4) can be accidentally erased either. For the rest of the switching device memory cells 90(1,1)(4)-90(M−1,N−1)(4) that are not coupled to the WL 192(0), the BL 194(0), and the SL 196(0), the switching voltages ($V_{GS}$) 114(1,1)(4)-114(M−1,N−1)(4) are all equal to 0.7V ($V_{GS}=V_G-V_S$=0V−(−0.7V)=0.7V). As a result, none of the switching device memory cells 90(1,1)(4)-90(M−1,N−1)(4) can be accidentally erased.

Figure 16:
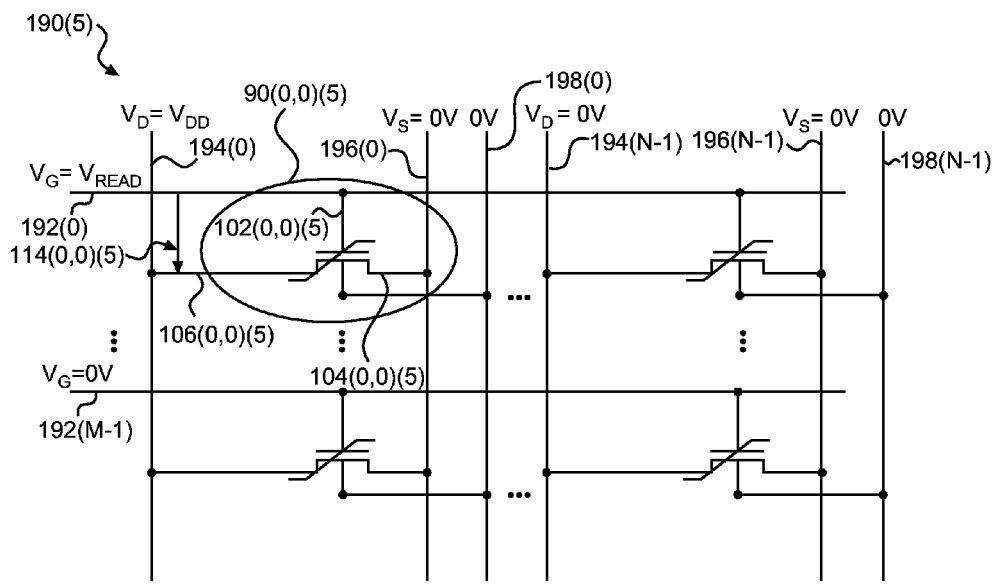
FIG. 16 is a schematic diagram of an exemplary M×N HK/MG MTP switching device memory array arranged according to the M×N HK/MG MTP switching device memory array of FIG. 11 to read information from a selected switching device memory cell.

FIG. 16 is a schematic diagram of an exemplary M×N MTP switching device memory array 190(5) arranged according to the M×N MTP switching device memory array 190 of FIG. 11 to read information from a selected switching device memory cell 90(0,0)(5). Common elements between FIG. 11 and FIG. 16 are shown with common element numbers, and thus will not be re-described herein.

With reference to FIG. 16, to read information from the selected switching device memory cell 90(0,0)(5), a memory controller (not shown) applies $V_G=V_{READ}$, $V_D=V_{DD}$, and $V_S$=0V to the WL 192(0), the BL 194(0), and the SL 196(0), respectively. In this regard, switching voltage ($V_{GS}$) 114(0,0)(5) is equal to $V_{READ}$ ($V_{GS}=V_G-V_S=V_{READ}-0V=V_{READ}$). If the $V_{READ}$ is greater than zero (0) and less than the program voltage ($V_{PG}$), the selected switching device memory cell 90(0,0)(5) can be safely read without being accidentally programmed. If the $V_{READ}$ is less than zero (0) and greater than the negative erase voltage (−$V_{ERA}$), the selected switching device memory cell 90(0,0)(5) can be safely read without being accidentally erased. To prevent other switching device memory cells 90(1,0)(5)-90(M−1,0)(5) in column 0 from being accidentally read, the memory controller applies $V_G$=0V to the rest of M−1 WLs 192(1)-192(M−1). Furthermore, to prevent other switching device memory cells 90(0,1)(5)-90(0,N−1)(5) in row 0 from being accidentally read, the memory controller applies $V_D$=0V to the rest of N−1 BLs 194(1)-194(N−1) and $V_S$=0V to the rest of N−1 SLs 196(1)-196(N−1).

The HK/MG MTP switching device 90 of FIG. 3 and the M×N MTP switching device memory array 190 of FIG. 11 may be provided in or integrated into any processor-based device. Examples, without limitation, include: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, a program logic circuit, and a logic process circuit.

Figure 17:
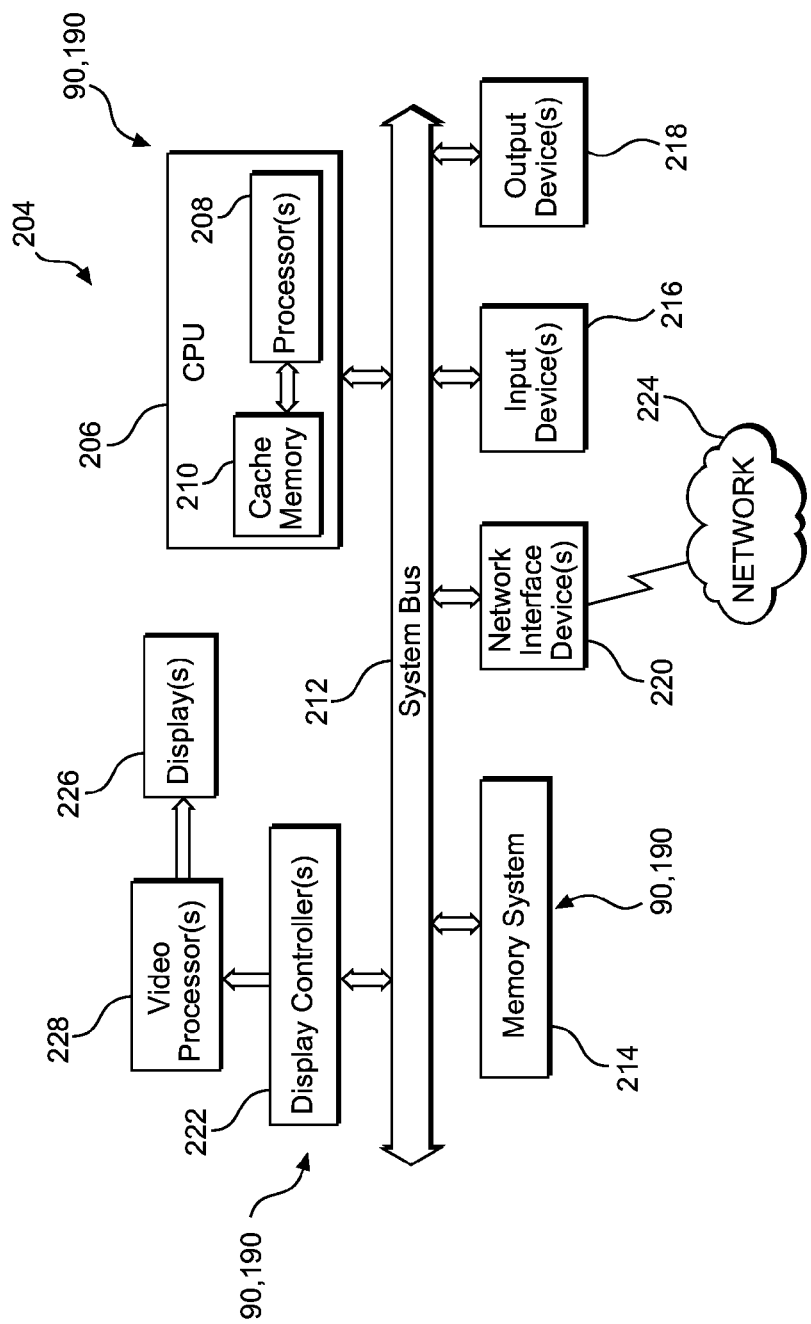
FIG. 17 is a block diagram of an exemplary processor-based system that can include the HK/MG MTP switching device in FIG. 3 configured to be programmed while avoiding a charge trap in the MOSFET in FIG. 3.

In this regard, FIG. 17 is a block diagram of an exemplary processor-based system that can include the HK/MG MTP switching device 90 in FIG. 3 configured to be programmed while avoiding charge traps in the MOSFET 92 in FIG. 3. In this example, a processor-based system 204 includes one or more central processing units (CPUs) 206, each including one or more processors 208. The HK/MG MTP switching device 90 in FIG. 3 and/or the M×N MTP switching device memory array 190 in FIG. 11 may be provided in the CPU(s) 206 to store binary information (e.g., state information, encryption key, etc.). The CPU(s) 206 may have cache memory 210 coupled to the processor(s) 208 for rapid access to temporarily stored data. The M×N MTP switching device memory array 190 may be provided as part of the cache memory 210. The CPU(s) 206 is coupled to a system bus 212 and can inter-couple devices included in the processor-based system 204. As is well known, the CPU(s) 206 communicates with these other devices by exchanging address, control, and data information over the system bus 212. Although not illustrated in FIG. 17, multiple system buses 212 could be provided, wherein each system bus 212 constitutes a different fabric.

Other devices can be connected to the system bus 212. As illustrated in FIG. 17, these devices can include a memory system 214, one or more input devices 216, one or more output devices 218, one or more network interface devices 220, and one or more display controllers 222, as examples. The HK/MG MTP switching device 90 and/or the M×N MTP switching device memory array 190 may also be provided in the memory system 214. The input device(s) 216 can include any type of input device, including but not limited to: input keys, switches, voice processors, etc. The output device(s) 218 can include any type of output device, including but not limited to: audio, video, other visual indicators, etc. The network interface device(s) 220 can be any devices configured to allow exchange of data to and from a network 224. The network 224 can be any type of network, including but not limited to: a wired or wireless network, a private or public network, a local area network (LAN), a wireless local area network (WLAN), a wireless wide area network (WWAN), or the Internet. The network interface device(s) 220 can be configured to support any type of communications protocol desired.

The CPU(s) 206 may also be configured to access the display controller(s) 222 over the system bus 212 to control information sent to one or more displays 226. The display controller(s) 222 sends information to the display(s) 226 to be displayed via one or more video processors 228, which process the information to be displayed into a format suitable for the display(s) 226. The display(s) 226 can include any type of display, including but not limited to: a cathode ray tube (CRT), a light emitting diode (LED) display, a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A high-k (HK)/metal gate (MG) (HK/MG) multi-time programmable (MTP) switching device comprising:
    a metal-oxide semiconductor (MOS) field-effect transistor (MOSFET) comprising:
        a body forming a channel region between a source electrode and a drain electrode;
        a gate electrode positioned above the body; and
        a dielectric layer disposed between the body and the gate electrode;
        wherein the MOSFET is configured to operate in a first state when a switching voltage ($V_{GS}$), which is applied between the gate electrode and the source electrode, is greater than a first threshold voltage for the MOSFET; and
        wherein the MOSFET is configured to operate in a second state different from the first state when the switching voltage ($V_{GS}$) is less than a second threshold voltage for the MOSFET; and
    a switching controller configured to:
        apply the switching voltage ($V_{GS}$) greater than the first threshold voltage between the gate electrode and the source electrode of the MOSFET to program the MOSFET to operate in the first state without an electrical current being generated in the channel region; and
        apply the switching voltage ($V_{GS}$) less than the second threshold voltage between the gate electrode and the source electrode of the MOSFET to program the MOSFET to operate in the second state without the electrical current being generated in the channel region.

2. The HK/MG MTP switching device of claim 1, wherein the switching controller is further configured to:
    apply the switching voltage ($V_{GS}$) greater than the first threshold voltage between the gate electrode and the source electrode of the MOSFET to program the MOSFET to operate in the first state while keeping the drain electrode floating to prevent the electrical current from being generated in the channel region; and
    apply the switching voltage ($V_{GS}$) less than the second threshold voltage between the gate electrode and the source electrode of the MOSFET to program the MOSFET to operate in the second state while keeping the drain electrode floating to prevent the electrical current from being generated in the channel region.

3. The HK/MG MTP switching device of claim 1, wherein the switching controller is further configured to:
    apply the switching voltage ($V_{GS}$) greater than the first threshold voltage between the gate electrode and the source electrode of the MOSFET to program the MOSFET to operate in the first state while maintaining equal voltages on the drain electrode and the source electrode to prevent the electrical current from being generated in the channel region; and
    apply the switching voltage (VGS) less than the second threshold voltage between the gate electrode and the source electrode of the MOSFET to program the MOSFET to operate in the second state while maintaining equal voltages on the drain electrode and the source electrode to prevent the electrical current from being generated in the channel region.

4. The HK/MG MTP switching device of claim 1, wherein the MOSFET is comprised of an n-channel MOSFET (nMOSFET) configured to:
    operate in an inversion state when the switching voltage ($V_{GS}$) is greater than or equal to a program voltage ($V_{PG}$) for the MOSFET; and
    operate in an accumulation state when the switching voltage ($V_{GS}$) is less than a negative erase voltage ($-V_{ERA}$) for the MOSFET.

5. The HK/MG MTP switching device of claim 4, wherein the switching controller is further configured to:
    apply a gate voltage equal to a positive one-half (½) of the program voltage ($V_{PG}$) (½$V_{PG}$) to the gate electrode; and
    apply a source voltage equal to a negative one-half (−½) of the program voltage ($V_{PG}$) (−½$V_{PG}$) to the source electrode;

wherein the gate voltage and the source voltage provide the switching voltage ($V_{GS}$) equal to the program voltage ($V_{PG}$) for programming the MOSFET in the inversion state.

6. The HK/MG MTP switching device of claim 4, wherein the switching controller is further configured to:
apply a gate voltage equal to the program voltage ($V_{PG}$) to the gate electrode; and
apply a source voltage equal to zero (0) to the source electrode;
wherein the gate voltage and the source voltage provide the switching voltage ($V_{GS}$) equal to the program voltage ($V_{PG}$) for programming the MOSFET in the inversion state.

7. The HK/MG MTP switching device of claim 4, wherein the switching controller is further configured to:
apply a gate voltage equal to a positive one-half (½) of the negative erase voltage ($-V_{ERA}$) ($-½V_{ERA}$) to the gate electrode; and
apply a source voltage equal to a negative one-half (-½) of the negative erase voltage ($-V_{ERA}$) (½$V_{ERA}$) to the source electrode;
wherein the gate voltage and the source voltage provide the switching voltage ($V_{GS}$) equal to the negative erase voltage ($-V_{ERA}$) for erasing the MOSFET.

8. The HK/MG MTP switching device of claim 4, wherein the switching controller is further configured to:
apply a gate voltage equal to the negative erase voltage ($-V_{ERA}$) to the gate electrode; and
apply a source voltage equal to zero (0) to the source electrode;
wherein the gate voltage and the source voltage provide the switching voltage ($V_{GS}$) equal to the negative erase voltage ($-V_{ERA}$) for erasing the MOSFET.

9. The HK/MG MTP switching device of claim 1, wherein the MOSFET is comprised of a p-channel MOSFET (pMOSFET) configured to:
operate in an inversion state when the switching voltage ($V_{GS}$) is less than a negative program voltage ($-V_{PG}$) for the MOSFET; and
operate in an accumulation state when the switching voltage ($V_{GS}$) is greater than or equal to an erase voltage ($V_{ERA}$) for the MOSFET.

10. The HK/MG MTP switching device of claim 9, wherein the switching controller is further configured to:
apply a gate voltage equal to a positive one-half (½) of the negative program voltage ($-V_{PG}$) ($-½V_{PG}$) to the gate electrode; and
apply a source voltage equal to a negative one-half (-½) of the negative program voltage ($-V_{PG}$) (½$V_{PG}$) to the source electrode;
wherein the gate voltage and the source voltage provide the switching voltage ($V_{GS}$) equal to the negative program voltage ($-V_{PG}$) for programming the MOSFET in the inversion state.

11. The HK/MG MTP switching device of claim 9, wherein the switching controller is further configured to:
apply a gate voltage equal to the negative program voltage ($-V_{PG}$) to the gate electrode; and
apply a source voltage equal to zero (0) to the source electrode;
wherein the gate voltage and the source voltage provide the switching voltage ($V_{GS}$) equal to the negative program voltage ($-V_{PG}$) for programming the MOSFET in the inversion state.

12. The HK/MG MTP switching device of claim 9, wherein the switching controller is further configured to:

apply a gate voltage equal to a positive one-half (i) of the erase voltage ($V_{ERA}$) (½$V_{ERA}$) to the gate electrode; and
apply a source voltage equal to a negative one-half (-½) of the erase voltage ($V_{ERA}$) ($-½V_{ERA}$) to the source electrode;
wherein the gate voltage and the source voltage provide the switching voltage ($V_{GS}$) equal to the erase voltage ($V_{ERA}$) for erasing the MOSFET.

13. The HK/MG MTP switching device of claim 9, wherein the switching controller is further configured to:
apply a gate voltage equal to the erase voltage ($V_{ERA}$) to the gate electrode; and
apply a source voltage equal to zero (0) to the source electrode;
wherein the gate voltage and the source voltage provide the switching voltage ($V_{GS}$) equal to the erase voltage ($V_{ERA}$) for erasing the MOSFET.

14. A means for switching a high-k (HK)/metal gate (MG) (HK/MG) multi-time programmable (MTP) switching device, comprising:
a metal-oxide semiconductor (MOS) field-effect transistor (MOSFET) comprising:
a body forming a channel region between a source electrode and a drain electrode;
a gate electrode positioned above the body; and
a dielectric layer disposed between the body and the gate electrode;
wherein the MOSFET is configured to operate in a first state when a switching voltage ($V_{GS}$), which is applied between the gate electrode and the source electrode, is greater than a first threshold voltage for the MOSFET; and
wherein the MOSFET is configured to operate in a second state different from the first state when the switching voltage ($V_{GS}$) is less than a second threshold voltage for the MOSFET; and
a means for controlling the MOSFET, configured to:
apply the switching voltage ($V_{GS}$) greater than the first threshold voltage between the gate electrode and the source electrode of the MOSFET to program the MOSFET to operate in the first state without an electrical current being generated in the channel region; and
apply the switching voltage ($V_{GS}$) less than the second threshold voltage between the gate electrode and the source electrode of the MOSFET to program the MOSFET to operate in the second state without the electrical current being generated in the channel region.

15. A method for preventing a charge trap when programming a high-k (HK)/metal gate (MG) (HK/MG) multi-time programmable (MTP) switching device, comprising:
determining a type of a metal-oxide semiconductor (MOS) field-effect transistor (MOSFET) comprised in an MTP switching device by a switching controller, wherein the MOSFET comprises a gate electrode, a source electrode, a drain electrode, and a body forming a channel region between the source electrode and the drain electrode;
applying a switching voltage ($V_{GS}$) greater than a first threshold voltage between the gate electrode and the source electrode of the MOSFET to program the MOSFET to operate in a first state without an electrical current being generated in the channel region; and
applying the switching voltage ($V_{GS}$) less than a second threshold voltage between the gate electrode and the source electrode of the MOSFET to program the MOS- FET to operate in a second state without the electrical current being generated in the channel region.

16. The method of claim 15, further comprising determining the type of the MOSFET comprised in the HK/MG MTP switching device as an n-channel MOSFET (nMOSFET) by the switching controller.

17. The method of claim 16, further comprising erasing the MOSFET by applying the switching voltage ($V_{GS}$) equal to a negative erase voltage ($-V_{ERA}$) of the MOSFET.

18. The method of claim 16, further comprising:
applying to the gate electrode a gate voltage equal to positive one-half (½) of the program voltage ($V_{PG}$) (½$V_{PG}$); and
applying to the source electrode a source voltage equal to negative one-half (–½) of the program voltage ($V_{PG}$) (–½$V_{PG}$).

19. The method of claim 16, further comprising:
applying to the gate electrode a gate voltage equal to the program voltage ($V_{PG}$); and
applying to the source electrode a source voltage equal to zero (0).

20. The method of claim 15, further comprising determining the type of the MOSFET comprised in the MTP switching device as a p-channel MOSFET (pMOSFET) by the switching controller.

21. The method of claim 20, further comprising erasing the MOSFET by applying the switching voltage ($V_{GS}$) equal to an erase voltage ($V_{ERA}$) of the MOSFET.

22. The method of claim 20, further comprising:
applying to the gate electrode a gate voltage equal to positive one-half (½) of the negative program voltage ($-V_{PG}$) (–½$V_{PG}$); and
applying to the source electrode a source voltage as a equal to negative one-half (–½) of the negative program voltage ($-V_{PG}$) (½$V_{PG}$).

23. The method of claim 20, further comprising:
applying to the gate electrode a gate voltage equal to the negative program voltage ($-V_{PG}$); and
applying to the source electrode a source voltage equal to zero (0).

24. A memory system based on high-k (HK)/metal gate (MG) (HK/MG) multi-time programmable (MTP) switching devices, comprising:
a memory array comprising a plurality of metal-oxide semiconductor (MOS) field-effect transistors (MOSFETs) arranged into M rows and N columns, wherein M and N are finite integers;
M word lines (WLs) coupled to the M rows, respectively;
N bit lines (BLs) coupled to the N columns, respectively;
N source lines (SLs) coupled to the N columns, respectively;
wherein a MOSFET among the plurality of MOSFETs comprises:
a body forming a channel region between a source electrode and a drain electrode;
a gate electrode positioned above the body and coupled to a respective WL among the M WLs; and
a dielectric layer disposed between the body and the gate electrode;
the source electrode coupled to a respective SL among the N SLs;
the drain electrode coupled to a respective BL among the N BLs;
wherein the MOSFET is configured to operate in a first state when a switching voltage ($V_{GS}$), which is applied between the gate electrode and the source electrode, is greater than a first threshold voltage for the MOSFET; and
wherein the MOSFET is configured to operate in a second state different from the first state when the switching voltage ($V_{GS}$) is less than a second threshold voltage for the MOSFET; and
a memory controller coupled to the M WLs, the N BLs, and the N SLs, wherein the memory controller is configured to:
apply the switching voltage ($V_{GS}$) between the respective WL among the M WLs and the respective SL among the N SLs to program the MOSFET to operate in the first state without an electrical current being generated in the channel region of the MOSFET; and
apply the switching voltage ($V_{GS}$) between the respective WL among the M WLs and the respective SL among the N SLs to program the MOSFET to operate in the second state without the electrical current being generated in the channel region of the MOSFET.

25. The memory system of claim 24, wherein:
each of the M WLs is configured to receive a gate voltage;
each of the N BLs is configured to receive a drain voltage; and
each of the N SLs is configured to receive a source voltage.

26. The memory system of claim 25, wherein each of the N BLs is configured to be floating.

27. The memory system of claim 24, wherein the plurality of MOSFETs is a plurality of n-channel MOSFETs (nMOSFETs).

28. The memory system of claim 24, wherein the plurality of MOSFETs is a plurality of p-channel MOSFETs (pMOSFETs).

29. The memory system of claim 24, wherein the memory array is integrated into a program logic circuit.

30. The memory system of claim 24, wherein the memory array is integrated into a logic process circuit.

31. The method of claim 15, further comprising keeping the drain electrode of the MOSFET floating.

32. The method of claim 15, further comprising applying to the drain electrode of the MOSFET a drain voltage that is equal to a source voltage applied to the source electrode of the MOSFET.

* * * * *